United States Patent [19]

Brunner et al.

[11] Patent Number: 5,210,494
[45] Date of Patent: May 11, 1993

[54] SAMPLE HEAD FOR NUCLEAR MAGNETIC RESONANCE WHOLE-BODY TOMOGRAPHY OR LOCALIZED IN-VIVO NUCLEAR MAGNETIC RESONANCE SPECTROSCOPY

[75] Inventors: Hermann Brunner, Schriesheim; Karl H. Hausser; Werner Veith, both of Heidelberg, all of Fed. Rep. of Germany

[73] Assignee: Max-Planck-Gesellschaft zur Forderung der Wissenschaften e.V., Fed. Rep. of Germany

[21] Appl. No.: 663,915

[22] Filed: Mar. 5, 1991

[30] Foreign Application Priority Data

Jul. 5, 1989 [DE] Fed. Rep. of Germany ....... 3922034

[51] Int. Cl.$^5$ .......................................... G01R 33/20
[52] U.S. Cl. ................................................ 324/309
[58] Field of Search ............... 324/300, 307, 309, 318, 324/322

[56] References Cited

U.S. PATENT DOCUMENTS

| | | |
|---|---|---|
| 4,435,680 | 3/1984 | Froncisz et al. ............. 324/316 |
| 4,633,180 | 12/1986 | Biehl et al. ................... 324/316 |
| 4,641,097 | 2/1987 | Bottomley et al. .......... 324/318 |
| 4,733,190 | 3/1988 | Dembinski ................... 324/318 |
| 4,751,464 | 6/1988 | Bridges ........................ 324/318 |
| 4,851,780 | 7/1989 | Dejon et al. ................. 324/322 |
| 4,887,039 | 12/1989 | Roemer et al. .............. 324/322 |
| 4,897,604 | 1/1990 | Carlson et al. .............. 324/318 |
| 4,987,370 | 1/1991 | Leussler et al. ............. 324/318 |
| 4,998,066 | 3/1991 | Wichern et al. ............. 324/322 |
| 5,045,792 | 9/1991 | Mehdizadeh ................. 324/318 |

FOREIGN PATENT DOCUMENTS

| | | |
|---|---|---|
| 0268083 | 10/1987 | European Pat. Off. . |
| 3512682 | 4/1985 | Fed. Rep. of Germany . |
| 2159958 | 6/1985 | United Kingdom . |

OTHER PUBLICATIONS

Journal of Physics E/Scientific Instruments, vol. 20, No. 12, Dec. 87, pp. 1487–1490, IOP Publishing Ltd., Bristol (GB) "Electric Fields and Losses in Lumped Element Resonators for ESR Spectroscopy" A. Sotgiu, et al.
Book from Hausser, K. H. and H. R. Kalbitzer, Springer-Verlag 1989, pp. 141–153, 179–187, "NMR für Mediziner und Biologen".
US–Book "Biomedical Magnetic Resonance Imaging" by Wehrle, Felex W., Derek Shaw and J. Bruce Kneeland, BCH Publishers, Inc. 1988, pp. 12–45.

*Primary Examiner*—Michael J. Tokar
*Attorney, Agent, or Firm*—Walter A. Hackler

[57] ABSTRACT

A sample head (50) for nuclear magnetic resonance whole-body tomography or localized in-vivo nuclear magnetic resonance spectroscopy comprises an RF coil (51) having a plurality of inductive sections in the form of metallic strips (53 to 60) and capacitive sections in the form of gaps (61 to 68) arranged alternately one behind the other in the direction of the RF current ($I_1$), so that the field lines (72) of the magnetic RF field ($H_1$) generated by the RF coil (51) extend in parallel to an axis (74) defined by the RF coil (51). The RF coil (51) forms a single unit with an outer jacket (52). The number of inductive and capacitive sections is such as to be just below that limit value above which the distribution of the field lines (71) of the electric RF field ($E_1$) produced by the said RF coil (51) changes from a first distribution (75), where there is a plane (76) between each inductive section (55) and the said axis (74) in which the strength of the electric RF field ($E_1$) is equal to zero, to a second distribution where the strength of the said electric RF field ($E_1$) rises in a substantially rotationally symmetrical pattern around the said axis, and linearly from the said axis toward the said RF coil, and this irrespective of the number of inductive sections present.

24 Claims, 14 Drawing Sheets

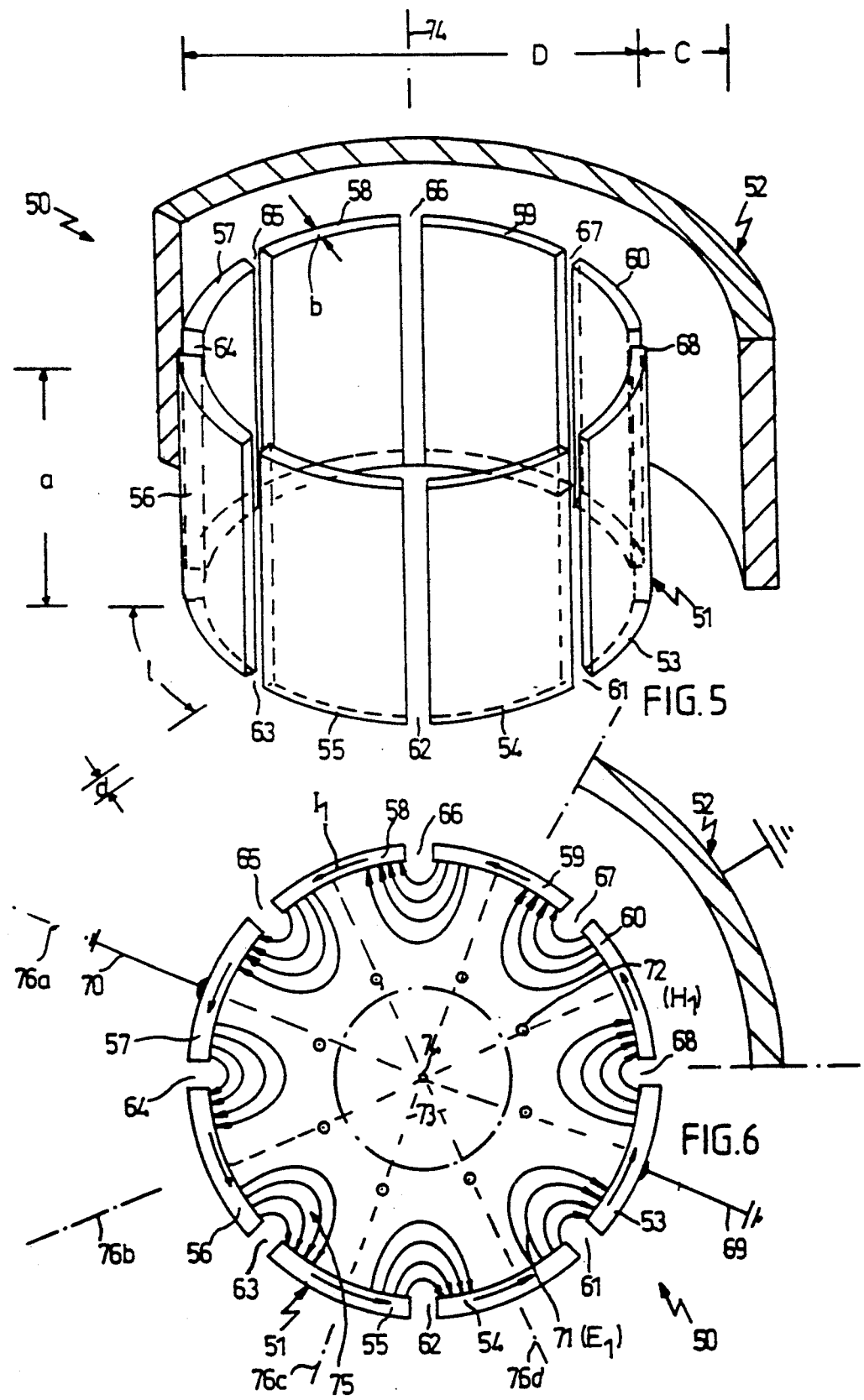

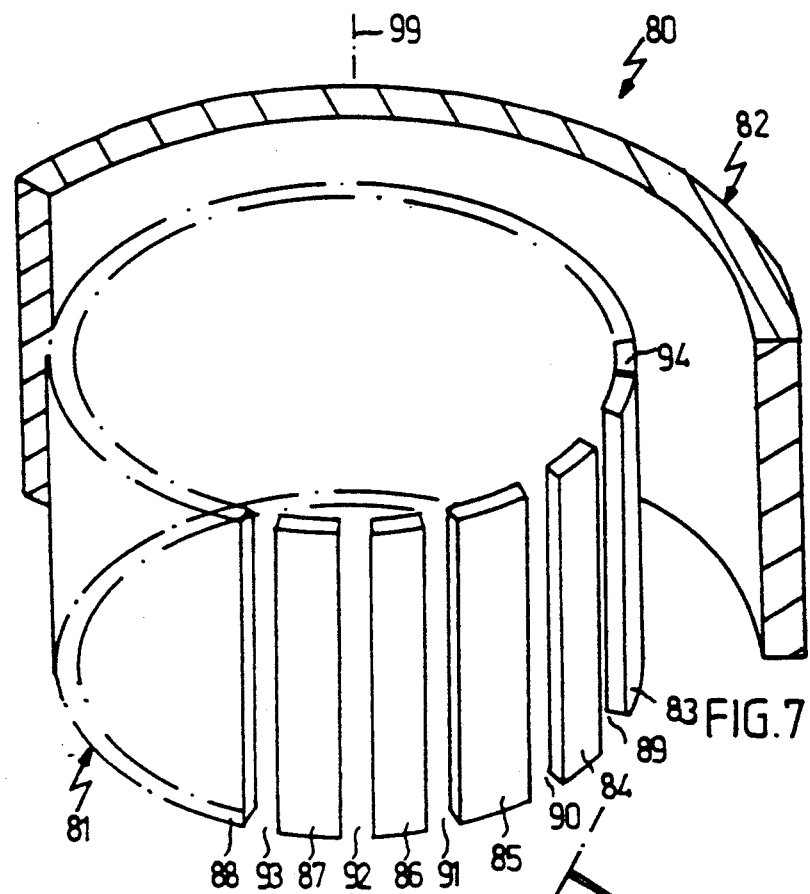
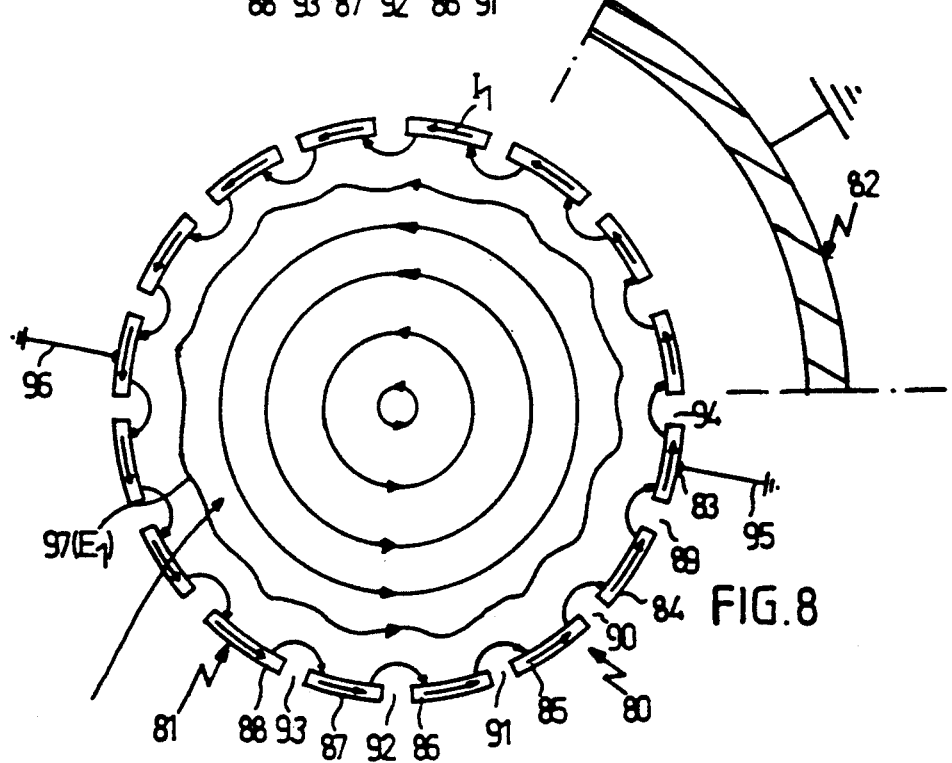

SAMPLE HEAD FOR NUCLEAR MAGNETIC RESONANCE WHOLE-BODY TOMOGRAPHY OR LOCALIZED IN-VIVO NUCLEAR MAGNETIC RESONANCE SPECTROSCOPY

The present invention relates to a sample head for nuclear magnetic resonance whole-body tomography or localized in-vivo nuclear magnetic resonance spectroscopy, comprising an RF coil having a plurality of inductive sections in the form of metallic strips, and capacitive sections arranged alternately one behind the other, in the direction of the RF current, so that the field lines of the magnetic RF field generated by the RF coil extend in parallel to an axis defined by the RF coil. A sample head of the described type has been known from DE-OS 35 12 682.

In nuclear magnetic resonance whole-body tomography, a whole human body, or part of a human body, is exposed to a constant magnetic field of high field strength and great homogeneity, and to a magnetic RF field whose field lines extend perpendicularly to the field lines of the constant magnetic field. It is then possible, with the aid of suitable methods, to produce sectional images of the human body, or of parts thereof, by exciting and measuring nuclear magnetic resonances in defined point-like volume areas of the cross-sectional plane.

More details regarding nuclear magnetic resonance whole-body tomography, and in particular the measuring methods used and the instrument set-ups required for this purpose, are described by the book entitled "NMR für Mediziner und Biologen" by Hauser, K.H. and H.R. Kalbitzer, Springer-Verlag 1989, or by the US book entitled BIOMEDICAL MAGNETIC RESONANCE IMAGING by Wehrli, Felix W., Derek Shaw and J. Bruce Kneeland, VCH Publishers, Inc., 1988.

The sample head known from the before-mentioned DE-OS 35 12 682 uses an "open" RF coil arrangement consisting of two saddle coils provided in mirror-symmetrical arrangement one relative to the other. Each of the saddle coils is composed of elongated metal strip sections, the latter being connected by their ends via insulating elements. Each of the two saddle coils consists of two vertical, parallel metal strips whose upper ends are interconnected by a metal strip in the form of an arc of circle. The lower ends of one vertical metal strip of each saddle coil are interconnected by a transverse metal strip to form an electrode, while the lower ends of the other two vertical metal strips are connected to one end of two other metal strips in the form of an arc of a circle whose opposite ends in their turn are connected by another transverse metal strip to form a second electrode arranged near the first-mentioned electrode and extending in parallel to the latter.

If current is caused to flow through the double saddle coil so produced, via the two electrodes, the magnetic RF field extends in a direction perpendicular to the coil surfaces which are defined by the two saddle coils and which extend in parallel one to the other. Although the coil consists of eight sections, it constitutes a series connection of two four-gap coils without metallic return line, for the purposes of the present invention.

In the case of the known coil arrangement, the insulating bodies between the ends of the metal strips act as capacitive elements, while the metal strips themselves act as inductive elements, it being understood that either solid bodies, or gases or capacitors may be used as insulating bodies.

The known arrangement is said to permit the realization of a simple structure because the metal strips, being electrically insulated from each other, can be joined easily and there is no need to produce a double saddle coil by bending a copper tube performing the function of the conductor.

Another coil arrangement for imaging nuclear magnetic resonance methods has been known from U.S. Pat. No. 4 733 190.

This arrangement uses a pair of RF coils whose individual coils are arranged in parallel and at a certain axial distance relative to each other. Each coil of the pair of coils comprises three circumferential metal strips whose ends are bent inwardly and maintained at a certain distance from the bent-over end of the respective neighboring strip. In this manner, one obtains again inductive sections formed by the metallic strips, and capacitive sections in the form of the air gaps formed by the bent-over strip ends.

In the case of the known coil arrangement, the current flows through the individual coils in such a way that the coil arrangement operates as a split coil. This means that although the field lines of the magnetic RF field pass through the individual coils in axial direction, they enter the space between the two individual coils in opposite direction. And consequently, the resultant direction of the magnetic RF field in the gap between the two individual coils extends perpendicularly to the axis of the coil arrangement. This enables the split coil to be used with its axis of symmetry extending in the direction of the constant magnetic field because when the body to be examined is introduced into the gap between the two individual coils, it will be passed by field lines of the magnetic RF field extending transversely to the axis of symmetry of the coil arrangement and, thus, perpendicularly to the field lines of the constant magnetic field.

Another coil arrangement for imaging nuclear magnetic resonance methods has been described by EF-OS 0 160 942.

In the case of this known coil arrangement, two metallic strips are arranged on the outer and inner surfaces of a hollow cylinder of elliptical cross-section. The broad sides of the body so formed are provided with one big window each, permitting free access to the interior of the body.

In the case of this known arrangement, the RF current flows in the direction of the longitudinal axis of the body, with the result that the field lines of the magnetic RF field pass the interior of the body in a direction perpendicular to its longitudinal axis.

The same applies by analogy to another coil arrangement described by U.S. Pat. No. 4 751 464. In the case of this coil arrangement, a plurality of 16 conductors is arranged on the imaginary wall of the hollow cylinder, inside a cylindrical screening case. The conductors are again passed, in axial direction, by RF current which is introduced into the conductors from the end faces of the screening case, via capacitive coupling elements.

In this manner, one obtains again a direction of the field lines of the magnetic RF field perpendicular to the longitudinal axis of the coil arrangement.

Another coil arrangement described by EP-OS 0 268 083 uses a surface resonator which is formed by a single winding of a strip-like electric conductor. The surface resonator has a funnel-like shape so that it can be applied as surface coil to the body under examination, either by its larger or by its smaller opening.

Finally, another resonator for electron spin resonance measurements has been known from DE-CS 32 37 250. This resonator, being employed in the microwave range, comprises two hollow-cylindrical segment-shaped components arranged symmetrically relative to the longitudinal axis of a cylindrical screening case. The distance of the hollow-cylindrical segment-shaped elements from the wall of the screening case is substantially equal to their radius. The publication also describes in this connection an arrangement comprising four hollow-cylindrical segment-shaped elements constituting each a sector of approx. 90° of a hollow cylinder. However, it is provided in this case that each pair of elements arranged opposite to each other, offset by 180°, is fed from one RF source, which means that the entire arrangement is fed from two RF sources, for the purpose of carrying out multiple resonance measurements.

Given the fact that, as has been mentioned before, the arrangement described last is intended for electron spin resonance measurements in the microwave range, the dimensions of this arrangement are in the order of a few millimeters only, or even smaller.

The arrangements discussed before, if they are capable at all for being used in connection with nuclear magnetic resonance whole-body tomography measurements, all have the following substantial drawback:

Modern nuclear magnetic resonance whole-body tomography operates at static magnetic fields of approx. 0.15 to 1.5 Tesla, which corresponds to a proton resonance frequency of approx. 6 to 60 MHz. Considerably higher magnetic fields in the range of 3 to 4 Tesla, corresponding to a proton resonance frequency of 130 to 170 MHz, are even used in localized in-vivo spectroscopy, as the resolution of the spectra increases in linear relationship to the field strength, due to the chemical shift. In practice, the following problems for example, are encountered in this connection:

On the one hand, it gets more and more difficult, with such field strengths, to produce the required constant magnetic field of the desired intensity, but also of the desired homogeneity, in the required large sample space, which may have dimensions of several decimeters. High-field magnets of above 0.3 Tesla, i.e. far above the saturation limit of iron, can be built up, however, only using the means of superconductivity technology. It is, therefore, clear that speaking of measuring spaces of a size in the order discussed above, any increase of the field strength is connected with an increase of cost far beyond any proportion.

It has, therefore, been a common aim in professional circles to make sample heads of the type described at the outset as small as possible so that the useful space of the superconductive magnet system is larger than the human body to be measured only by the amount absolutely necessary.

Another problem which in the past has been ignored or given too little importance lies in the fact that during tomography measurements the human body is exposed not only to the constant magnetic field, but also to the RF field.

Although professional circles are in agreement today that neither the constant magnetic field nor the magnetic RF field gives rise to physiological trouble—apart from indirect effects on auxiliary devices (such as heart pacemakers)—it still should be considered that any electromagnetic RF field includes an electric RF field which necessarily interacts with the dielectric substances of the human body, in particular, via dipole interaction, with the molecules of the water which, as is generally known, make up more than half of the human body.

It is a particularly critical aspect in this connection that the dielectric losses, i.e. the energy transfer from the electric RF field into the substance of the human body, rise by the square of the electric field strength. This means that when the electric field strength doubles, the dielectric losses multiply by the factor four. However, these dielectric losses are extremely troublesome for two reasons: Firstly, the RF field is distorted due to the non-uniformity in space of the losses, which is the result of the inhomogeneity of the sample, in the present case the human body, and this distortion leads to additional artifacts and has a negative effects on the quality of the image. Secondly, the absorbed energy, which may absolutely be in the range of 1 W/Kg of weight of the body, leads to a local rise in temperature. This energy represents about the limit of what is still to be regarded as definitely harmless, from the medical point of view. On the other hand, it is very much desirable to increase the active magnetic field strength of the magnetic RF field, in order to improve the measuring sensitivity and to reduce the measuring time required for a nuclear magnetic resonance tomogram.

Given the fact that the dielectric losses rise with both, the field strength and the frequency of the RF field, the before-mentioned practical upper limit of 1.5 Tesla, corresponding to a proton resonance frequency of 60 MHz, therefore, has to be regarded as a compromise between the generally desirable (even) higher magnetic field strength and/or measuring frequency and the one that can still be accepted in view of the dielectric losses. If a way can be found to reduce the latter, it will be possible to extend nuclear spin tomography to higher fields and to improve still further the parameters which are of extreme importance for medical diagnostics, three-dimensional resolution and the measuring time.

This aspect has not been considered at all in connection with the diverse sample heads of the prior art that have been discussed above. In the case of resonators with an axial path of the RF current (U.S. Pat. No. 4 751 464 and EP-OS 160 942), for example, the field lines of the electric RF field pass the sample space in a direction perpendicular to its longitudinal axis so that the body under examination is exposed to these field lines in full.

Above all, however, the arrangement known from DE-OS 35 12 682 provides the drawback that it works as an "open" arrangement, i.e. as an antenna where the field lines of the electric and the magnetic RF fields close a long way outside of the coil arrangement, more or less accidentally, through components present in the environment. It is not possible with such "open" coil arrangements to comply with the compact design requirement because it is not possible to concentrate the field lines inside the coil, due to the "open" design. Consequently, the desired electric and/or magnetic field strength has to be attained in the case of such designs by a corresponding increase of the RF current, with all the drawbacks connected therewith.

Now, it is the object of the present invention to improve a sample head of the type described above in such a way as to enable a compact design and, on the other hand, to provide a sample space in which the electric RF field strength assumes a minimum value only, while the magnetic RF field strength remains invariably high.

The invention achieves this object by the fact that the RF coil forms a single unit with an outer jacket and that the number of inductive and capacitive sections is such as to be just below that limit value above which the distribution of the field lines of the electric RF field produced by the RF coil changes from a first distribution, where there is a plane between each inductive section and the axis in which the strength of the electric RF field is equal to zero, to a second distribution where the strength of the electric RF field rises in a substantially rotationally symmetrical pattern around the axis, and linearly from the axis toward the RF coil, and this irrespective of the number of inductive sections present.

This solves the object underlying the invention fully and perfectly.

It has been found in a surprising way, in connection with the present invention, that when the number of inductive sections and, thus, also the number of capacitive sections is increased, this will not only result in an improvement of the Q value of the circuit, but will instead lead to a distribution of the field lines of the electric RF field where the electric field strength in the coil center is extremely low. The considerations and investigations conducted in this connection have shown, however, that the number of capacitive and inductive sections may not be increased at desire. Rather, there exists a limit value for that number up to which the electric field in the coil center will get lower and lower until suddenly, when the number of sections is increased above that limit value, the distribution of the field lines of the electric RF field will change completely and a degenerate distribution of the field lines will develop which will remain substantially uniform for any higher number of sections. Although in the case of this distribution, the amount of the electric field strength is likewise equal to zero at the exact center of the coil, the curve of the electric field strength rises almost linearly between that point and the inductive and capacitive sections constituting the coil.

Now, it is the basic idea of the invention to select the number of capacitive and inductive sections to be just below the before-mentioned limit value so as to make the best possible use of the large-space reduction of the electric RF field inside the coil.

Practical tests have shown that a reduction of the electric field strength by approx. one order of magnitude can be attained in this manner in the area of the coil center and up to one third of its radius. Since, as has been mentioned before, the dielectric losses in the human body change by the square of the electric field strength, it will be readily appreciated that the invention achieves a drastic reduction of the dielectric losses in the human body in nuclear magnetic resonance whole-body tomography measurements or localized in-vivo nuclear magnetic resonance spectroscopy measurements.

The distribution of the field lines of the magnetic RF alternating field remains almost unchanged if one proceeds according to the method of the invention—a fact which is also rather surprising—and the field lines continue to pass through the interior of the RF coil axially and with very high homogeneity.

The invention thus opens up completely novel applications for nuclear magnetic resonance whole-body tomography and localized in-vivo nuclear magnetic resonance spectroscopy because the strength of the magnetic RF alternating field can be increased by approximately one order of magnitude without increasing the dielectric losses in the human body under examination, as compared with conventional sample heads.

Another surprising positive effect is achieved by the invention due to the fact that the RF coil and the outer jacket are combined to a single unit, as this fact leads to a field concentration such that the field lines emanating from the RF coil are restricted to the interior of the sample head and no radiation losses are encountered. This feature leads to a circuit Q which otherwise cannot be achieved, as will be demonstrated below, by way of practical measurements.

Contrary to the resonators used in electron spin resonance spectroscopy, as known from microwave technology, only a relatively small distance is required between the outside of the RF coil and the interior of the outer jacket. This leads to extremely small dimensions of the sample head according to the invention, so that the latter is also suited for tomography units using very high magnetic fields.

It has already been mentioned that a higher number of the inductive and capacitive sections also means a higher Q because any increase of the number of capacitive sections leads to a reduction in the effective length of the inductive sections for the RF current and, thus, a reduction of the ohmic losses.

Compared with conventional sample heads, the invention therefore provides all at once, by relatively simple means, three substantial advantages that could not possibly be expected.

According to a preferred embodiment of the invention, the capacitive sections are designed as gaps extending in parallel to the field lines of the magnetic RF field.

This feature provides the advantage that one obtains a defined field distribution where the field lines of the electric RF magnetic field extend at an angle of exactly 90° relative to the field lines of the constant magnetic field.

It is preferred in this connection if the gaps are filled with a dielectric.

This feature provides the advantage that the inductive sections are bridged mechanically, which also increases the stability of the arrangement.

It is further preferred in connection with the before-mentioned embodiments if the edges of the metallic strips adjoining the gaps are bent off in a direction away from the interior of the RF coil so that the capacitive sections come to lie outside of the interior of the coil.

This feature, which as such has been known before, provides the advantage that by bringing the capacitive sections out of the interior of the coil, the electric field strength prevailing in the inner space is further reduced.

According to certain embodiments of the invention, the strips are flat.

This feature provides the advantage that the RF coil can be built up in the manner of polygons, which may provide constructional advantages in certain cases. In addition, flat strips can be produced more easily and at lower cost.

Alternatively it is, however, also possible to use curved strips, in which case the strips are preferably bent in the direction of the RF current.

It is possible in this manner to implement annular RF coils of the type known as such. Structures of particularly high mechanical strength are obtained when the strips are given a curvature, either alternatively or additionally, in a direction transverse to their longitudinal direction.

According to certain embodiments of the invention, the metallic strips are rigidly interconnected at the capacitive sections.

As has been mentioned before, this feature provides the advantage that particularly rigid, maybe even self-supporting RF coils are obtained.

According to certain variants of this embodiment of the invention, the metallic strips may be bonded together by means of an adhesive, and the latter may preferably form a dielectric. One obtains in this manner a mechanical connection and, at the same time, an electric improvement, as described before.

Other alternative embodiments of the invention provide, however, that the metallic strips are screwed together, in which case the screws used may of course be non-conductive, for example plastic screws or PTFE screws.

Another group of embodiments of the invention provides that the width of the gaps in the direction of the RF current is between 0.1% and 2%, preferably in the range of 0.5% of the circumference of the RF coil.

This range has been found in practice to be particularly advantageous because it permits on the one hand to attain the desired distribution of the inductive and the capacitive elements, while on the other hand the capacitive sections can be made as broad as possible in the direction of the RF current in order to reduce the ohmic losses in the inductive areas.

According to another group of embodiments of the invention, a first dimension of the metallic strips, in the direction of the RF current, is not greater than four times a second dimension perpendicular thereto.

This feature provides the advantage that the use of particularly "broad" strips, viewed in a direction transverse to the sense of propagation of the RF current, enables the ohmic losses, too, to be kept low, the effective cross-section of the strips being large.

According to another group of embodiments according to the invention, a dimension of the metallic strips perpendicular to the direction of the RF current is equal to between 10% and 50%, preferably 20%, of the diameter of the RF coil.

This range has also been found to be particularly advantageous, in particular when arrangements comprising several separate coils are to be used.

According to certain embodiments of the invention, the outer jacket exhibits a substantially circular-cylindrical shape and embraces the RF coil at a distance equal to between 5% and 20%, preferably 10%, of the diameter of the RF coil.

With the stated range of values the advantage that has been indicated before, namely that a sufficient reflux and, thus, concentration of the field lines is possible with a minimum of space remaining between the RF coil and the outer jacket, can be achieved in a particularly convincing manner. In this manner, the overall dimensions of the resonator are kept as small as possible.

According to another group of embodiments of the invention, the sample head comprises two RF coils in Helmholtz arrangement, in the manner known as such.

Further, it is particularly preferred if the sample head comprises four RF coils, with every two of them forming a pair provided in Helmholtz arrangement and the axes of the pairs extending perpendicularly one to the other.

Such an arrangement provides the substantial advantage that, as a so-called Bloch arrangement, it permits to carry out induction measurements where the nuclear spins excited via the one pair of coils induce the measuring signal in the other pair of coils, while at the same time extreme electric decoupling exists between the two pairs of coils. On the other hand, such an arrangement also provides the advantage that the substance under examination can be exposed simultaneously to two excitation signals of different phase position so that a circular-polarized excitation field develops in the substance being measured, and the measuring signal can be detected by a quadrature receiver.

In the case of the before-described embodiments comprising a Helmholtz arrangement it is particularly preferred if the RF coils are designed as conventional saddle coils.

For, this feature provides the advantage to facilitate access to the interior of the coil, as in the case of sample heads of the kind of interest for the present invention the longitudinal axis of the RF coil extends transversely to the direction of the constant magnetic field so that when superconductive solenoid coils are used for generating the constant magnetic field it is necessary to have access to the RF coil from a direction perpendicular to its longitudinal axis.

With respect to arrangements comprising two pairs of Helmholtz coils it is further particularly preferred if the saddle coils are designed and arranged in such a way that each saddle coil of a pair is in contact with, and fixed to, the two other saddle coils of the other pair by at least one point.

This feature offers the advantage to provide a self-supporting arrangement of the totally four RF coils, which are in contact with each other at a total of eight points in space, thus forming a stable framework.

A particularly preferred embodiment of the invention is obtained when the saddle coils comprise two strips in the form of annular segments, as well as two elongated strips which are preferably curved in the longitudinal and/or transverse direction and whose free ends extend at an angle of 90° relative to those strips which have the form if annular segments.

These features offer the advantage to provide a particularly simple arrangement suited for use in connection with superconductive magnet systems with usual cryostats.

Further, it is preferred if at least one line for the RF current, serving as grounding line, is designed for fastening the metallic strips on the screening case.

This feature provides the advantage that the stability can be further increased without having to use additional mounting arrangements that might disturb the field lines. The symmetry of the RF coils of the sample head and the distribution of the electric RF field have the effect that planes are encountered inside the sample head where the electric RF field strength is equal to zero so that grounding can be effected safely in these areas. This is recommendable in view of the large extension of the sample head in order to be sure that only the desired oscillation mode will be excited in the circuit. The grounding lines may then simultaneously serve as mountings.

Finally, the sample head according to the invention may be used with advantage as surface coil.

Other advantages of the invention will appear from the specification and the attached drawing.

It is understood that the features that have been described before and will be explained hereafter may be used not only in the described combinations, but also in any other combination, or individually, without leaving the scope and intent of the present invention.

Certain embodiments of the invention will now be described in more detail with reference to the drawing in which:

FIG. 5 shows a sample head similar to FIGS. 1 and 3, but comprising an RF coil which is split eight times;

FIG. 6 shows a view similar to those of FIGS. 2 and 4, but illustrating the sample head according to FIG. 5;

FIG. 7 shows another sample head, similar to FIGS. 1, 3 and 5, but with an RF coil split sixteen times;

FIG. 8 shows a view similar to those of FIGS. 2, 4 and 6, but illustrating the sample head according to FIG. 7;

In developing large sample heads and/or resonators for nuclear magnetic resonance tomography, the frequencies required in the sample head are between 6 to 60 MHZ, corresponding to wave lengths of 50 to 5 m, and, for localized in-vivo spectroscopy, between 80 to 200 MHZ, corresponding to wave lengths of approximately 4 to 1.5 m. However, the design of suitable sample heads and/or the resonators used therein gets more and more difficult as the wave length decreases, and in addition the absorption of RF energy increases. This absorption, which is harmful for the object under examination in the measuring space, is due to the conductivity of the object under examination which produces a leakage current in the RF field prevailing in the measuring space.

Figure 1:
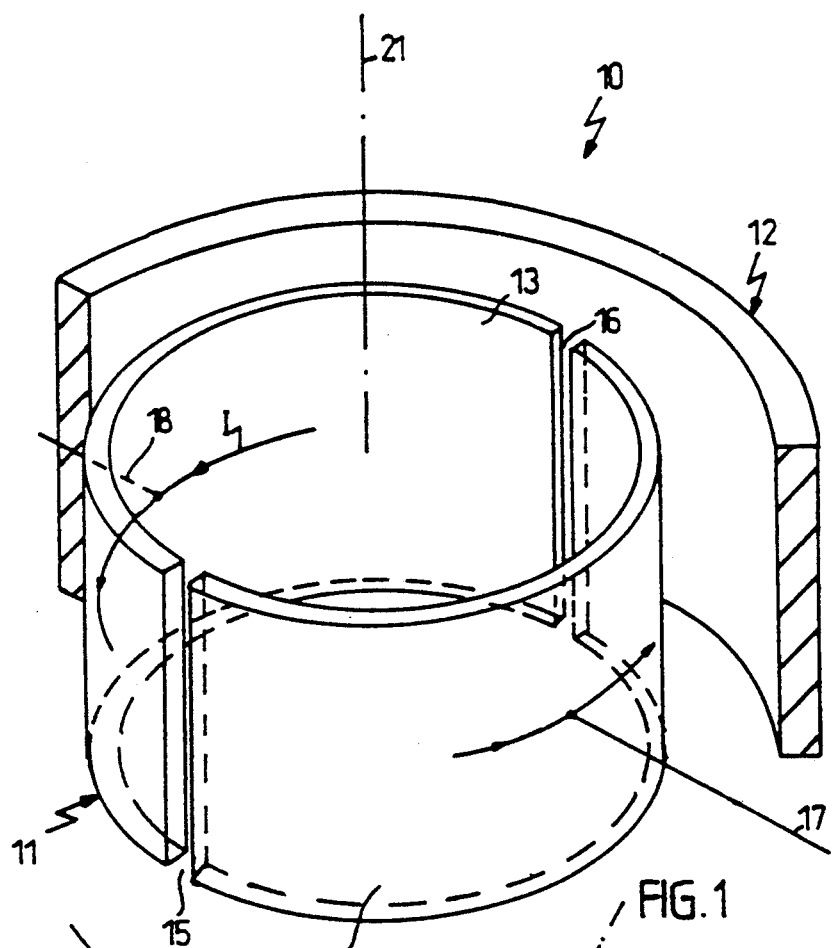
FIG. 1 shows a perspective view of a sample head, broken away in part, comprising an RF coil consisting of a double-split arrangement with elements in the form of hollow cylinder segments and an outer jacket forming an integrated unit with the RF coil.
Figure 2:
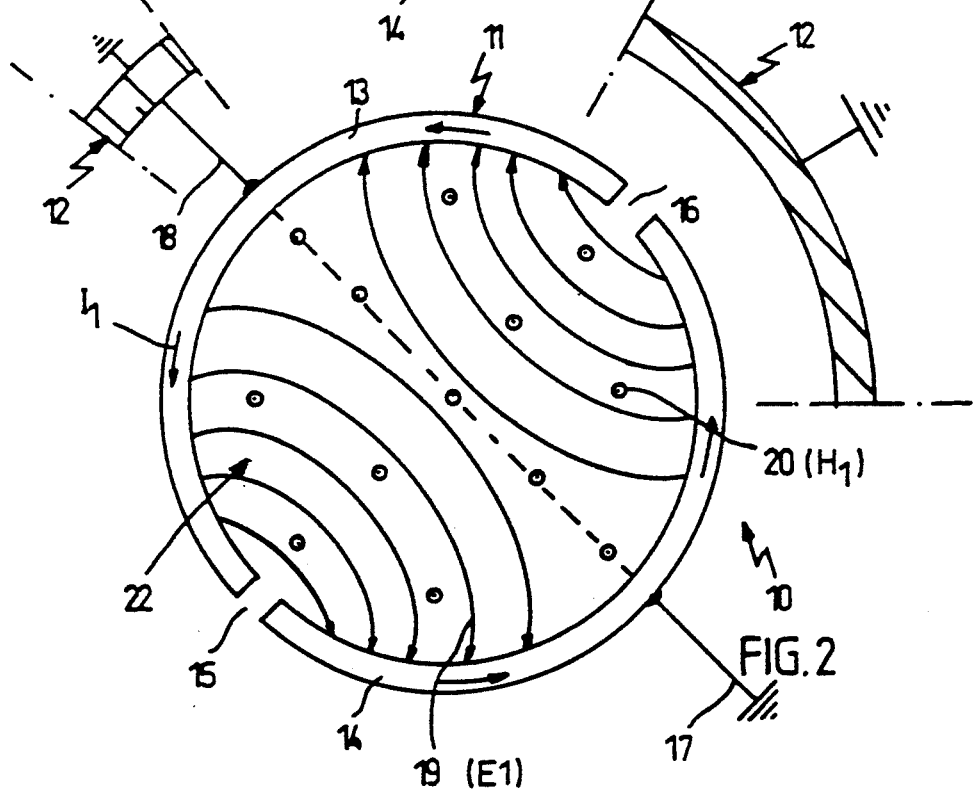
FIG. 2 shows a top view of the arrangement according to FIG. 2.

These conditions are illustrated by FIGS. 1 and 2 which show a first sample head 10 comprising an RF coil 11 which is surrounded by a cylindrical outer jacket 12.

The RF coil 11 consists of two strips 13 and 14 designed in the form of hollow cylinder segments or two half-shells. The free ends of the strips 14 and 14 are separated by gaps 15 and 16. A grounding line 17 is connected radially to the first strip 13, while another line 18, serving as additional grounding line, is connected radially to the second strip 14.

In terms of high-frequency technology, the RF coil 11 consists of inductive sections formed by metallic strips 13, 14 and of capacitive sections formed by the gaps 15 and 16.

The RF coil 11 is supplied with RF energy in the conventional manner, using usual coupling means which have been omitted in FIG. 1, and in the other figures as well, for the sake of clarity. RF coupling can be realized in the conventional manner, by inductive means, via a loop in the space of the magnetic RF field. The structure of the oscillating circuit will then enforce the desired magnetic RF field, in particular if the circuits are grounded symmetrically via the lines 17 and 18, in the described way.

If the axis of the RF coil 11 is designated by 21, one obtains the distribution 22 of the field lines 19, 20 where the field lines 20 of the magnetic RF field $H_1$ extend in parallel to the axis 21, and the field lines 19 of the electric RF field $E_1$ extend perpendicularly to the axis 21. The field lines 20 of the magnetic RF field $H_1$ pass the interior of the RF coil 11 in this case in a substantially homogeneous way, while the field lines 19 of the electric RF field $E_1$ show an inhomogeneous distribution 22 due to the fact that they extend from a non-flat electrode, namely the first strip 13, to another non-flat electrode, namely the second strip 14.

Figure 3:
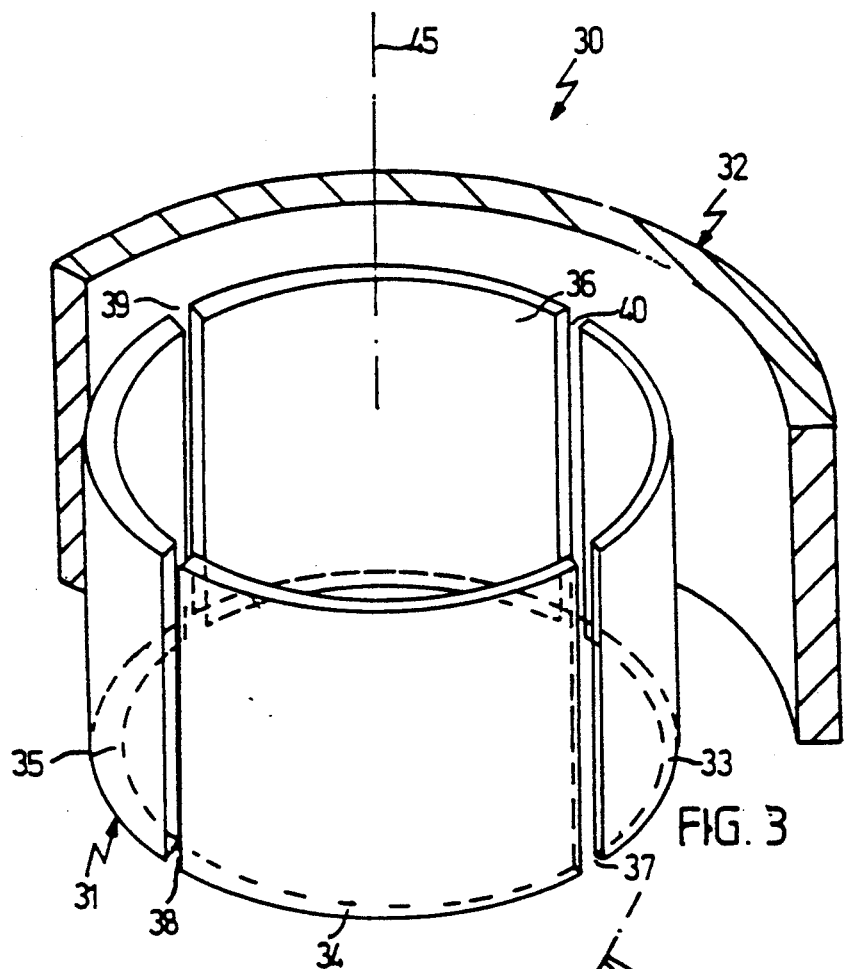
FIG. 3 shows another sample head, similar to FIG. 1, but with the RF coil split four times.
Figure 4:
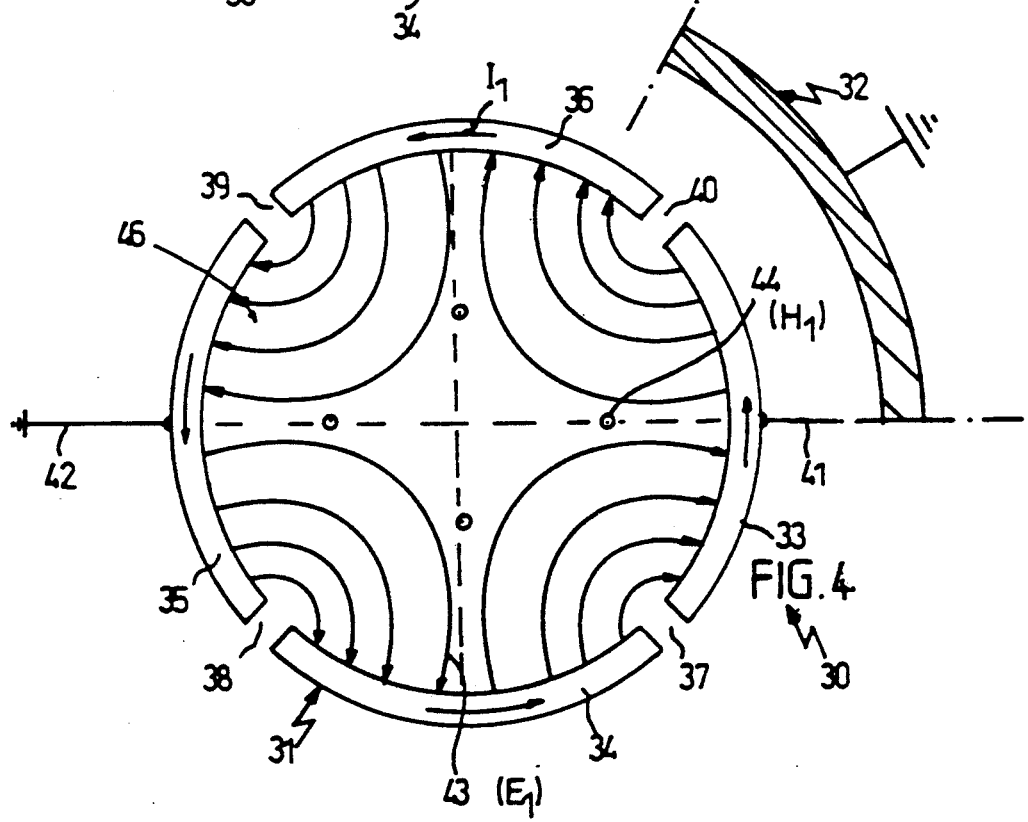
FIG. 4 shows a view similar to that of FIG. 2, but illustrating the sample head of FIG. 3.

FIGS. 3 and 4 illustrate the respective conditions for a second sample head 30, which again contains an RF coil 31 accommodated in an outer jacket 32.

In the case of the sample head 30, however, the RF coil 31 comprises four strips 33 to 36 forming between them gaps 37 to 40. As can be clearly seen in FIG. 4, grounding lines 41, 42 are connected to only one of the strips 33 and 35, respectively. The field lines 43 of the electric RF field $E_1$ and the field lines 44 of the magnetic RF field $H_1$ extend again perpendicularly and in parallel, respectively, to the axis 45, and show the distribution 46 illustrated in FIG. 4.

FIGS. 5 and 6 illustrate the respective conditions for a third sample head 50 which again comprises an RF coil 51 enclosed in a cylindrical outer jacket 52.

In the case of the sample head 50, however, the RF coil 51 comprises eight strips 53 to 60, forming eight gaps 61 to 68, and the grounding lines 69 and 70 are connected only to the strip 53 and the opposite strip 57, respectively, in the illustrated arrangement, although they may also be connected to four, or to all of the strips.

Field lines 71 of the electric RF field $E_1$, and field lines 72 of the magnetic RF field $H_1$ show the distribution 56 appearing from FIG. 6 and extend perpendicularly and in parallel, respectively, to the axis 24 of the RF coil 51.

Figure 16:
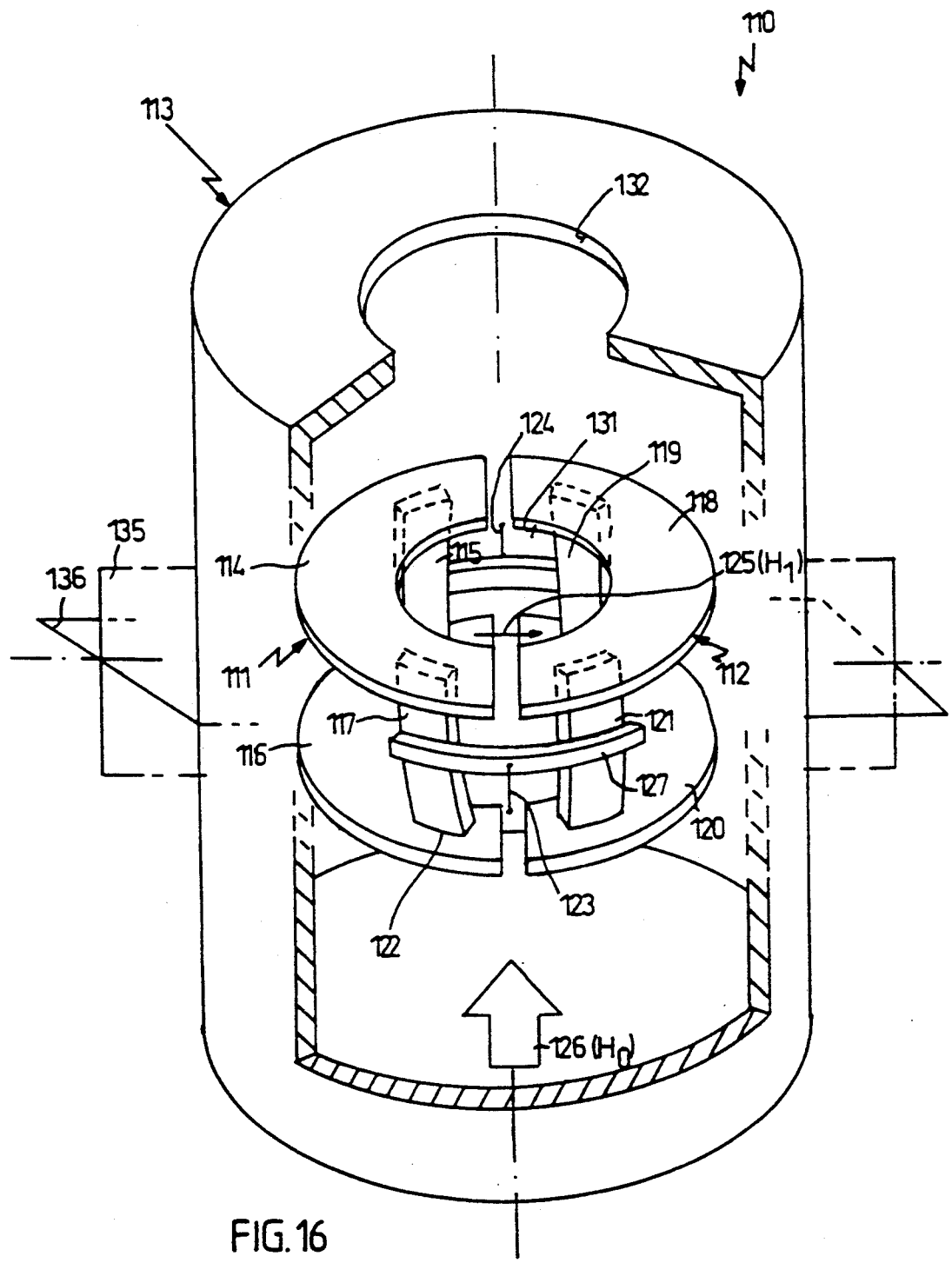
FIG. 16 shows a perspective view, broken away in part, of a resonator of a design similar to FIGS. 3 and 4, in a condition ready for operation.

It is a result of the distribution 75 of the electric RF field $E_1$ that, depending on the number of gaps n, a number of n/2 of planes will occur where the electric RF field strength $E_1$ is equal to zero. This could be proved by measurements taken in practical experiments, for example for an arrangement with four gaps. The measurements are illustrated in FIG. 16.

FIGS. 7 and 8 show a fourth sample head 80 comprising an RF coil 81 which is again accommodated in a cylindrical screening case 82.

The RF coil 81 now comprises sixteen strips, some of which are designated by 83 to 88 in FIGS. 7 and 8. Correspondingly, there exist sixteen gaps 89 to 94.

Grounding lines 95 and 96 may again be connected to diametrically opposite strips 83, etc., in the manner described in connection with FIG. 6.

The field lines 97 of the electric RF field $E_1$ extend again perpendicularly to the axis 99 of the RF coil 81.

FIGS. 9 to 12 show once more, by way of comparison, the field lines 19, 43, 71, 97, respectively, for the distributions 22, 46, 75, 98, respectively, of the electric RF field $E_1$ for the sample heads 10, 30, 50, 80, respectively.

Figure 10:
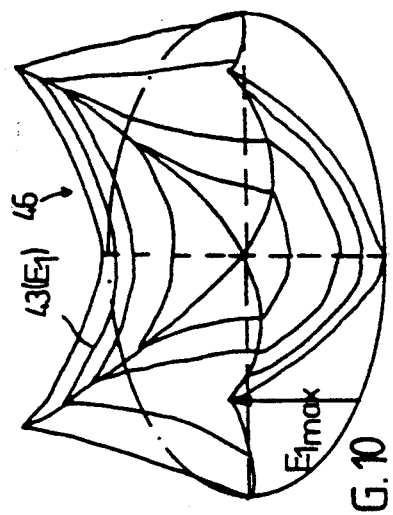
FIG. 10 shows a representation similar to that of FIG. 9, but for the sample head according to FIG. 3.
Figure 9:
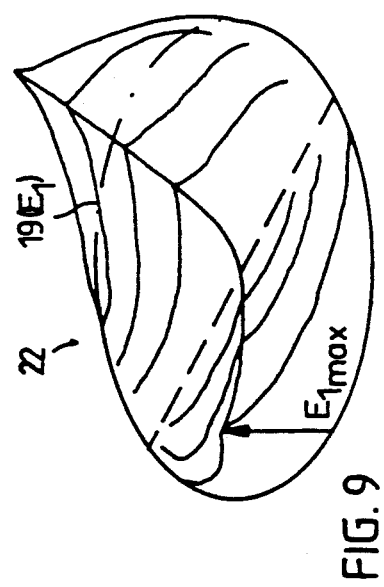
FIG. 9 is a perspective view illustrating the development of the amount of the electric field strength over a radial cross-sectional area of the RF coil of the sample head according to FIG. 1.
Figure 11:
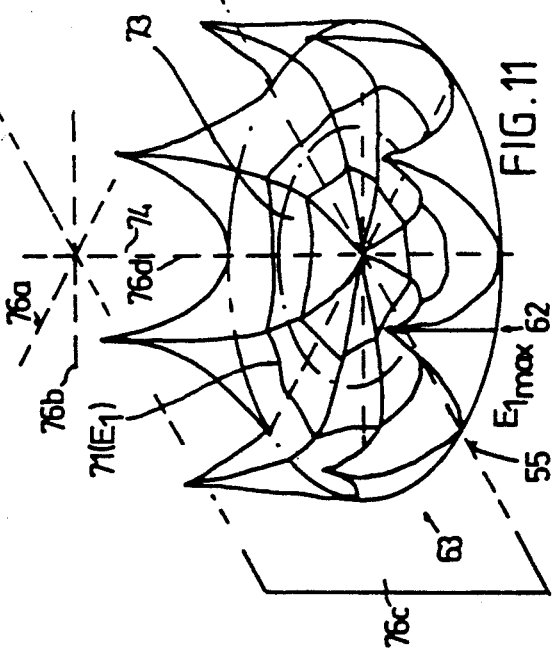
FIG. 11 shows a representation similar to those of FIGS. 9 and 10, but for the sample head according to FIG. 5.

When regarding FIGS. 9 to 11, it will be readily appreciated that the distribution 22 prevailing in the case of the two-slot RF coil 11 changes regularly, initially to the distribution 46 prevailing in the case of the four-slot RF coil 31 and then to the distribution 75 prevailing in the case of the eight-slot RF coil 51.

In the cases illustrated in FIGS. 9, 10 and 11, planes leading from the center of each inductive section to the axis, where the overall electric field strength is equal to zero, have been indicated by dashed lines. In the case of the two-slot RF coil (FIG. 9) there exists one such plane, while in the case of the four-slot coil (FIG. 10) there exist two such planes, and in the case of the eight-slot coil (FIG. 11), one can clearly distinguish four such planes indicated by 76a, 76b, 76c and 76d. For the sake of clarity, plane 76c is shown more clearly in the drawing and it will be readily seen that it leads from the center of the inductive section, symbolized by the third strip 55, to the axis 74 and that it only contains such points in space where the electric field strength is equal to zero.

It should be noted at this point that the present discussion is not restricted to the case where the number of strips and the number of gaps is a power of 2, but that instead the present considerations apply as well to RF coils with six, ten and maybe even 12 slots. In principle, odd numbers of gaps (three, five, seven, nine, eleven) would also be possible, although such arrangements should be less advantageous generally, due to their reduced symmetry.

The amount of the electric field strength is indicated in each of the representations of FIGS. 9 to 11.

If one now compares the distributions 22, 46 and 75 of FIGS. 9, 10 and 11, respectively, it will be readily appreciated that, as the number of sections of the RF coil rises, the curve of the electric field strength gets flatter and flatter in the central area of the coil. This is indicated in FIG. 11 by an area 73, which is also shown in FIG. 6, and where the electric field strength has dropped to a minimum value.

The reduction of the electric field strength in the central area 73 may be explained by the fact that the field lines 19, 43, 71, respectively, of the electric RF field $E_1$ cannot assume any curvature and that, due to this limitation, the field lines will extend more and more less far into the interior of the RF coil, as the number of capacitive and inductive sections increases, as appears clearly from a comparison between FIGS. 2, 4 and 6, as the sectors of the cross-sectional area defined by the capacitive and inductive sections have an eve smaller angle at center.

Figure 12:
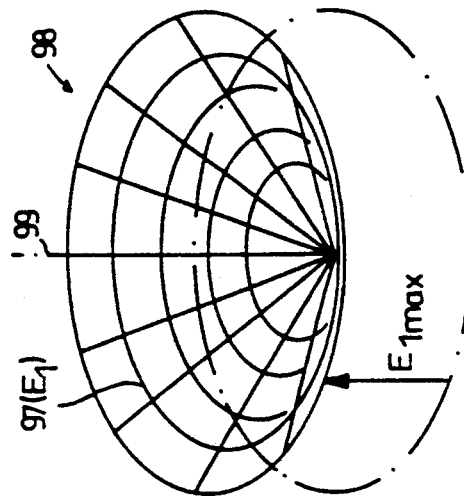
FIG. 12 shows a representation similar to those of FIGS. 9, 10 and 11, but for the sample head according to FIG. 7.

If one now regards FIGS. 8 and 12, it is clear that this development cannot be continued indefinitely.

For, once the number of inductive and capacitive sections of the RF coil is increased beyond a certain limit value, in the embodiment illustrated in FIGS. 7 and 8 to sixteen, the distribution 98 of the field lines 97 of the electric RF field $E_1$ changes suddenly to the degenerate form illustrated in FIG. 12. In the case of this distribution 98, the electric field strength at the exact center of the RF coil 81, i.e. at the axis 99, is still equal to zero, but rises from this center to the periphery of the RF coil 81 along a practically linear curve, and in rotationally symmetrical distribution 98. Once the before-mentioned limit value is exceeded, the distribution 98 practically no longer changes as a function of the number of sections.

Contrary to the distribution 75 prevailing in the eight-slot RF coil 51 illustrated in FIGS. 5 and 6, there does not, therefore, exist a central area where the electric field strength is very small over a larger space.

The conditions discussed above can be recognized also in FIG. 13 where the electric field strength E has been plotted, at a predetermined distance from the axis, along the ordinate, and the number n of the inductive and capacitive sections of the RF coils have been plotted along the abscissa, all in arbitrary units.

The electric field strength E was measured at a distance of about one fifth of the radius, measured from the center of the respective RF coil.

Figure 13:
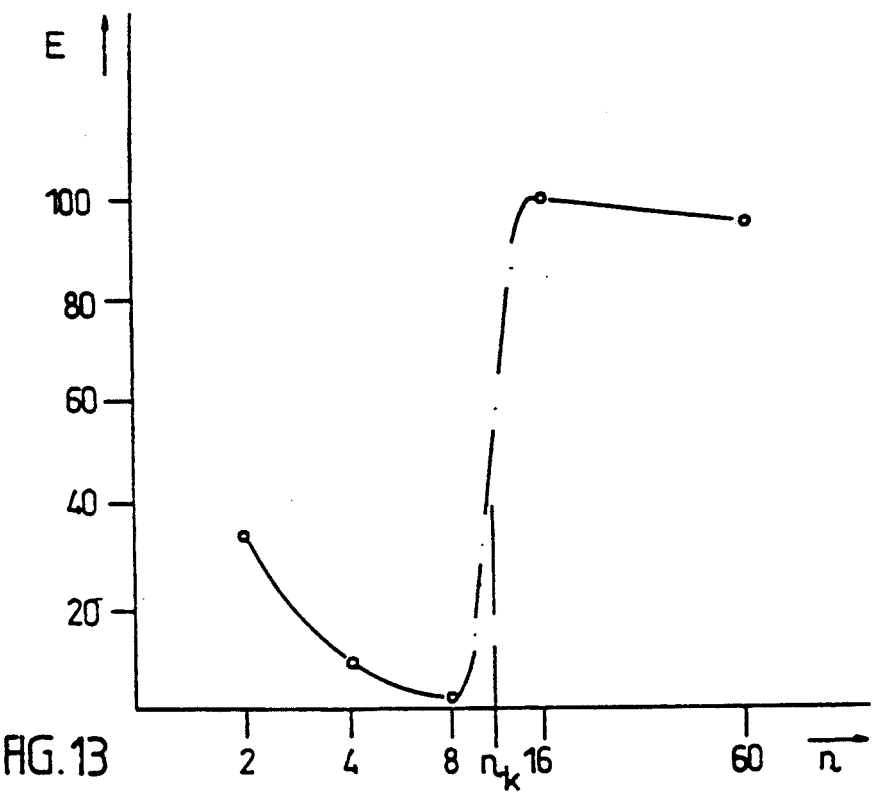
FIG. 13 shows a diagrammatic representation of values measured in practice, illustrating the variation of the electric field strength, at a predetermined distance from the axis of a RF coil in resonators of the kind illustrated in FIGS. 1, 3, 5 and 7, as a function of the number of slots in the RF coil.

The curve of FIG. 13 now shows that the electric field strength E decreases drastically from the two-slot to the four-slot and to the eight-slot coil, whereafter it rises suddenly for the sixteen-slot coil, in order to remain almost constant for even higher numbers of n.

The measurements illustrated in FIG. 13, therefore, prove very clearly that the distribution of the field lines of the electric RF field changes regularly at the beginning, and that at a certain point the form of distribution suddenly changes and that the new form of distribution then remains unchanged for even higher values of n.

In addition, FIG. 13 shows that the electric field strength decreases by about one order of magnitude between a two-slot and an eight-slot RF coil. If one considers, as has been mentioned before, that the dielectric losses are a function of the square of the electric field strength, FIG. 13 clearly shows that a reduction of the dielectric losses by approx. two orders of magnitude can be attained.

In FIG. 13, $n_k$ indicates a critical number for the inductive and capacitive sections This critical number $n_k$ is used to symbolize the transition from the regular distributions 22, 46 and 75 to the degenerate, constant distribution 98.

The exact figure of this critical number $n_k$ depends in each case on the RF coil used. Practical tests and theoretical considerations have shown, however, that the critical number $n_k$ should as a rule be equal to ten so that in most of the cases an optimum result will be achieved when the number n is selected to be eight (arrangement illustrated in FIGS. 5 and 6). One obtains in this case an area of minimum electric field strength 73 of optimum size and, therefore, a large measuring area where no, or only extremely small, dielectric losses are encountered.

Figure 14:
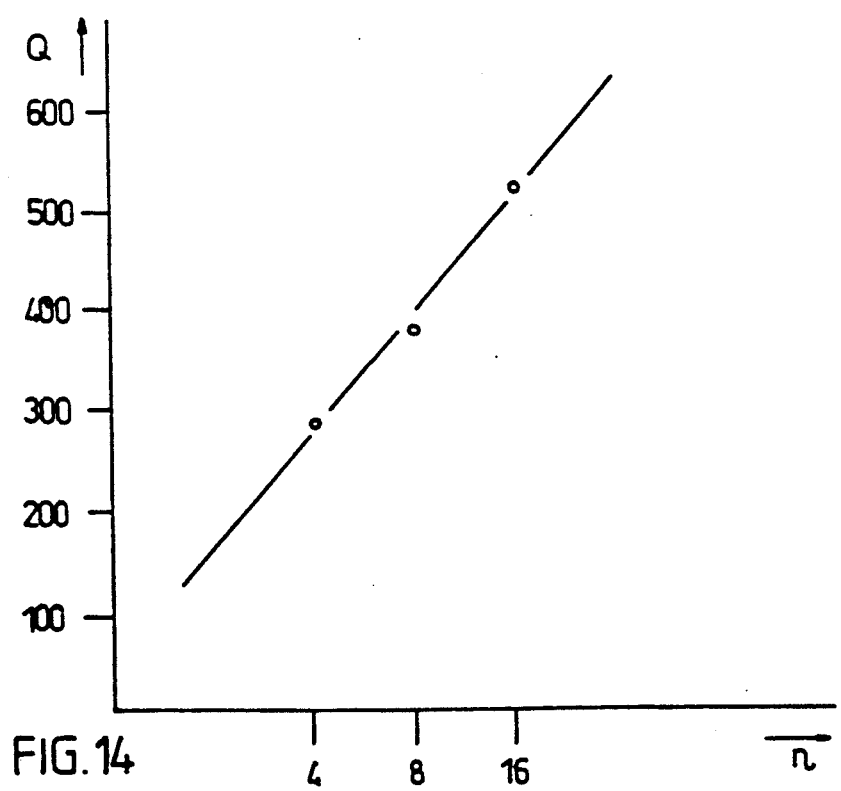
FIG. 14 shows a diagrammatic representation of values measured in practice, illustrating the variation of the Q value as a function of the number of slots of RF coils in resonators according to FIGS. 1, 3, 5 and 7.

FIG. 14 shows, by comparison, the results of other measurements where the quality Q has been plotted as a function of the number n. FIG. 14 shows clearly that the value of Q increases linearly as a function of the square number n. This is due to the fact that, as has been discussed before, the length of the path of the RF current decreases as the number of capacitive sections rises Returning once more to the embodiment illustrated in FIGS. 5 and 6, with the above findings in mind, the following conclusions can be drawn regarding the practical dimensions of the sample head 50 shown in these figures:

As an illustration, the necessary computations will be carried out for a characteristic example where the diameter is D = 80 cm. The magnet required in this case for generating the constant magnetic field, therefore, must have a diameter of more than one meter.

If the radius is identified by R (R = D/2) and the width of the strips 53 to 60, measured in the axial direction, is identified by a, the inductance of the RF coil 51 can be defined by the following formula:

$$L = \mu_0 R \left( \ln \frac{8R}{a} - 2 \right)$$

In order to make L as small as possible, the width a should be made as big as possible, because the characteristic resistance $$\sqrt{L/C}$$

is to be as small as possible. In addition, broad strips (great a value) have an advantageous effect on the homogeneity of the magnetic RF field $H_1$ and the circuit Q. If R = 0.4 m and a = 0.16 m, then L = 5.03 $10^{-7}$ Henry according to the above formula.

This corresponds to a capacitance value C of 5 pF at a frequency of 100 MHz.

The circuit regarded in the present case being an eight-slot circuit where the capacitive sections are connected in series, the C value to be employed for each gap 61 to 68 must be eight times the value just computed, namely $C_8$ = 40 pF.

Given the fact that each of the gaps 61 to 68 forms a plate capacitor, the gap width d can be determined by application of the following known formula:

$$C_8 = \epsilon_0 \epsilon \, F/d = \epsilon_0 \epsilon \, ab/d$$

If one assumes that the thickness b of the strips 53 to 60 is equal to 1 cm, the following values are obtained for the capacitance of the plate capacitor:

| f/MHz | $C_8$/pF | $d_0$ (air gap)/mm | d(PTEE)/mm |
|---|---|---|---|
| 200 | 10 | 1.415 | 2.83 |
| 100 | 40 | 0.354 | 0.708 |
| 50 | 160 | 0.0885 | 0.177 |

The values of the fourth column are twice the values of the third column, PTFE having a dielectric constant of 2 so that the width 2 has to be doubled if the same capacitance value is to be achieved.

The wave length at 100 MHz is 3 m, the circumference of the circle is 2.51 m, i.e. somewhat smaller than the wave length. In the presence of eight gaps, the length of each strip, being 31.4 centimeters, corresponds approximately to 10% of the wave length.

If two RF coils 51 are employed in Helmholtz arrangement (this arrangement will be discussed in more detail further below), the entire arrangement has a height of 2 by 16 centimeters, plus a distance of 24 centimeters, for example, totalling 56 centimeters, which is a little more than the sixth part of the wave length.

For all these reasons, the resonant circuit must be screened by an outer jacket in order to prevent the numerous antennas from becoming active. It is for this reason that the outer jacket 52 is absolutely necessary in order to maintain the magnetic reflux. The distance c between the outer jacket 52 and the RF coil 51 is only 10 cm in the described example and, thus, at least one order of magnitude below the respective distances employed in microwave arrangements used in electron spin resonance spectroscopy, related to the diameter D.

Figure 15:
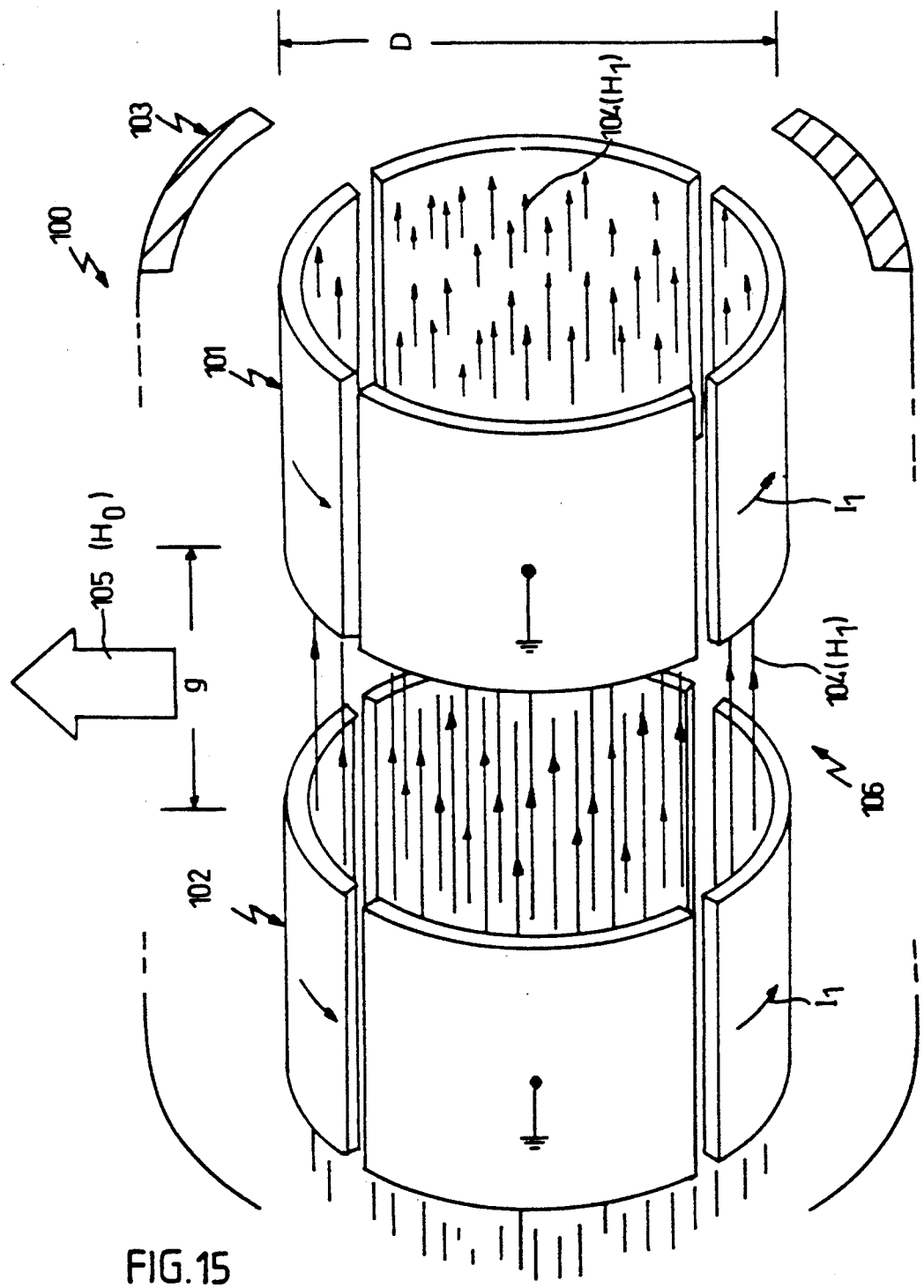
FIG. 15 shows a perspective View of another sample head comprising two RF coils in Helmholtz arrangement in a constant magnetic field of a nuclear magnetic resonance tomograph.

FIG. 15 shows a fifth embodiment of a sample head 100 comprising a first RF coil 101 and a second RF coil 102. The coils 101, 102 are again enclosed by an outer jacket 102. The field lines 104 of the magnetic RF field $H_1$ pass both coils 101, 102 in axial direction so that a particularly homogeneous field distribution is encountered, especially in a space 106 between the coils 101, 102.

The space 106 has a width g which is selected to be smaller than half the diameter D of the coils 101, 102, in order to fulfill the so-called Helmholtz condition.

Reference numeral 105 indicates the direction of the constant magnetic field $H_0$, which extends perpendicularly to the axis of the coils 101, 102.

The RF current, which is supplied to both coils 101, 102 in equal phase, is designated by $I_1$.

Figure 17:
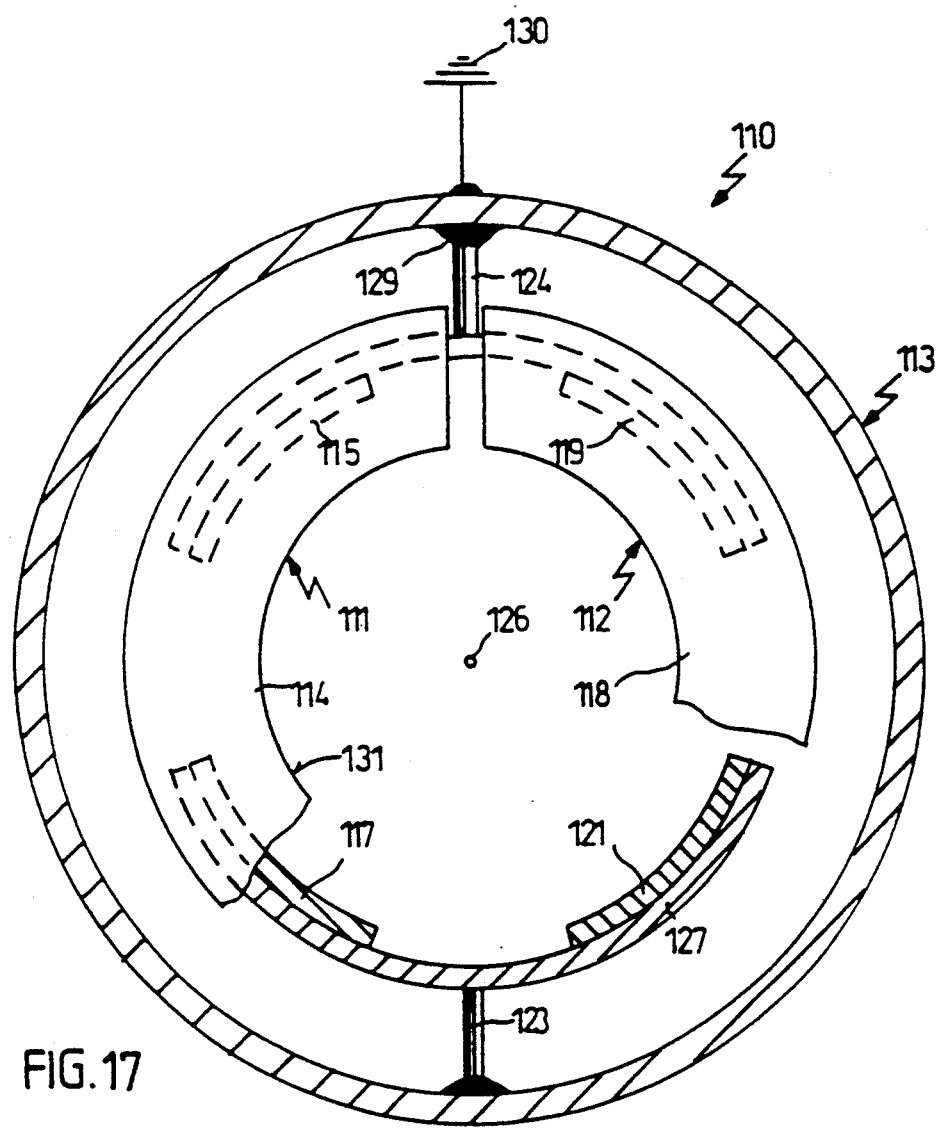
FIG. 17 shows a radial cross-section through the resonator according to FIG. 16.

FIGS. 16 and 17 show a sixth embodiment of a sample head 110.

The sample head 110 comprises a first RF coil 111 and a second RF coil 112, again enclosed by a cylindrical outer jacket 113.

The first RF coil 111 comprises four strips 114 to 117, the second RF coil 112 comprises likewise four strips 118 to 121, in mirror-symmetrical arrangement relative to each other.

Reference numeral 122 indicates that gaps are provided between the strips 114 to 121, in the manner that has been described before and that will be discussed hereafter in more detail by reference to FIGS. 23 to 25.

The strips 114, 116, 118 and 120 are designed in the form of annular disk segments, while the strips 115, 117, 119 and 121 take the form of flat strips or of slightly curved strips. The curvature of the last-mentioned strips may be directed either along their longitudinal axis and/or in a direction perpendicular thereto.

Consequently, each RF coil 111, 112 is designed in the form of a saddle coil where good access is ensured to the interior of the coil. In addition, these coils 111, 112 are provided in Helmholtz arrangement.

The coils 111, 112 are grounded by a first line 123 and a second line 124.

Reference numeral 125 stands for the field lines of the electric RF field $H_1$ which extend perpendicularly to the axis of the sample head 110. In contrast, the constant magnetic field $H_0$ extends in parallel to the axis of the sample head 110, as has been indicated by a field line 126.

The RF coils 111, 112 are grounded each by an earth bar 127, which interconnect electrically and mechanically the strips 117 and 121 on the one hand, and the strips 115 and 119 on the other hand.

Reference numerals 135 and 136 are used in FIG. 16 to identify the two planes where the electric field strength is equal to zero; this corresponds to the case illustrated in FIG. 10 where the two planes, in which the electric field strength is equal to zero, are shown by dashed lines.

FIG. 17 shows by way of additional details that the first line 123 and the opposite second line 124 are soldered to the screening case 113 at 129, and that the latter is connected to frame, as indicated at 130.

It has been mentioned before that saddle coils provide good access to the interior of the coil, and this in particular in the case of Helmholtz arrangements.

FIGS. 16 and 17 show in this connection, at 131, the openings formed by the particular design of the strips 114, 116, 118, 120 in the form of annular segments; these openings are in alignment with one or two openings 132 in one end face, or in both end faces, of the outer jacket 113.

Further, FIGS. 16 and 17 show clearly that the RF coils 111, 112 form a self-supporting structure which is additionally fixed, in a mechanically stable manner, in the outer jacket 113 by the electric lines 123, 124 so that no additional supporting elements are required.

It should be noted at this point that the restriction to a four-gap RF coil in the arrangements described last, by reference to FIGS. 15 to 17, has been chosen only for reasons of simplicity and should by no means be understood as a recommendation to depart from the eight-gap arrangement which has been recognized before to be the optimum solution. This applies also to the embodiments that will be describe hereafter and for which sometimes arrangements with a smaller number of n have been used, likewise for reasons of simplicity.

Figure 18:
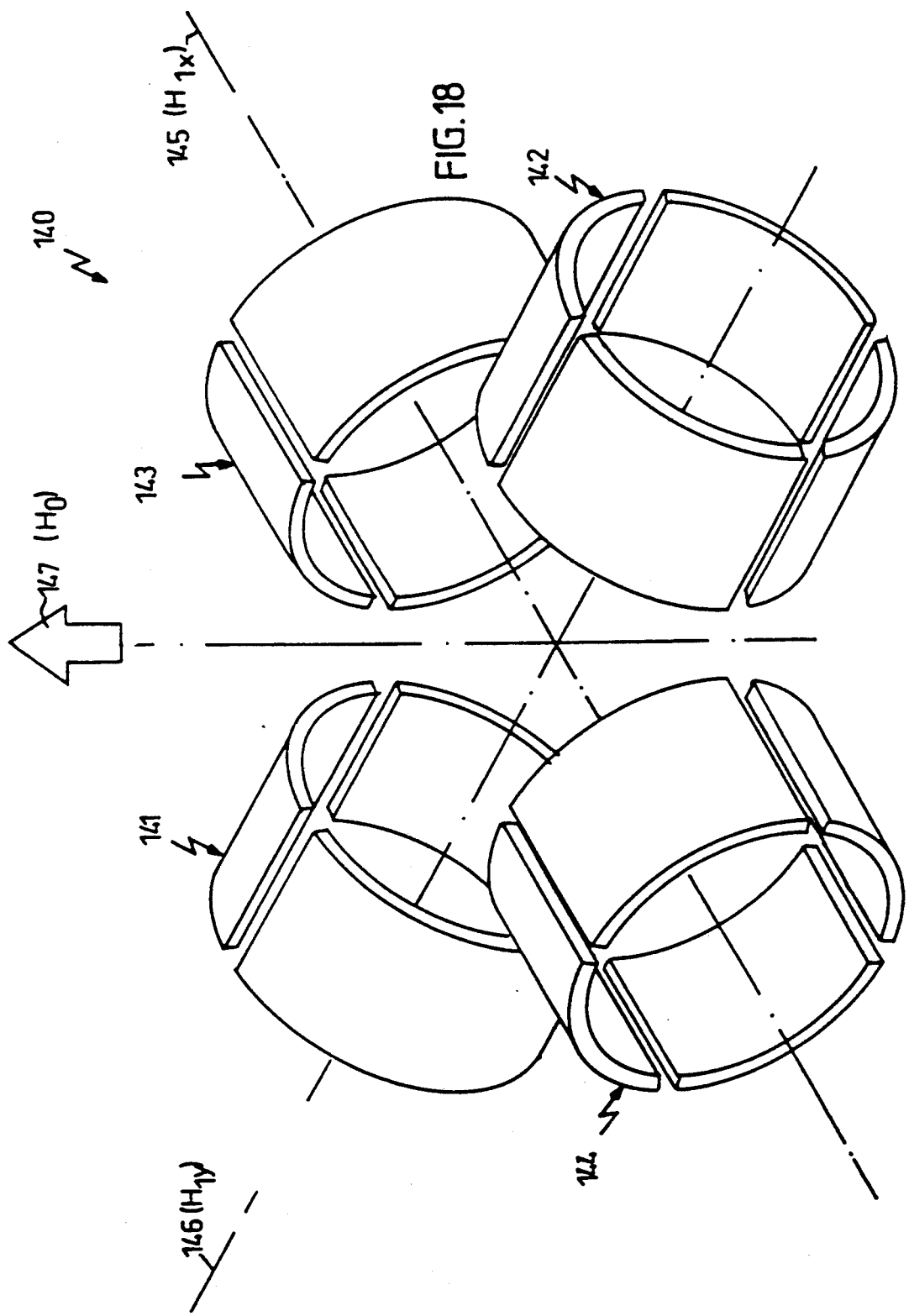
FIG. 18 shows a perspective view of two pairs of RF coils intended for conducting experiments with circular polarization and quadrature detection, or for conducting induction experiments.

FIG. 18 now shows a seventh embodiment of a sample head 140 according to the invention comprising a first pair of RF coils 141, 142 and a second pair of RF coils 143 and 144.

Axes 145, 146 for the magnetic RF field $H_{1x}$ and $H_{1y}$, respectively, extend at an angle of 90° one relative to the other, and at an angle of 90° relative to a third cartesian axis 147 extending in the direction of the constant magnetic field $H_0$.

The arrangement of FIG. 18 enables measuring samples to be examined in other, different modes.

According to one of these modes, the two pairs are supplied with excitation signals of equal frequency, but different phase position so that a circular-polarized magnetic RF field is generated in the measuring space (at the coordinate origin in the representation of FIG. 18). Such a circular-polarized field can be used with advantage for measurements using quadrature detection.

According to another measuring mode, excitation is effected via one pair of RF coils, while the other pair of RF coils serves as receiver. Such an induction arrangement according to the so-called Bloch measuring method provides efficient decoupling of the two circuits (the transmitter and the receiver) so that in the presence of high excitation field strengths only measuring signals, with the exclusion of injected spurious signals, will be transmitted from the transmitter to the receiver.

Figure 19:
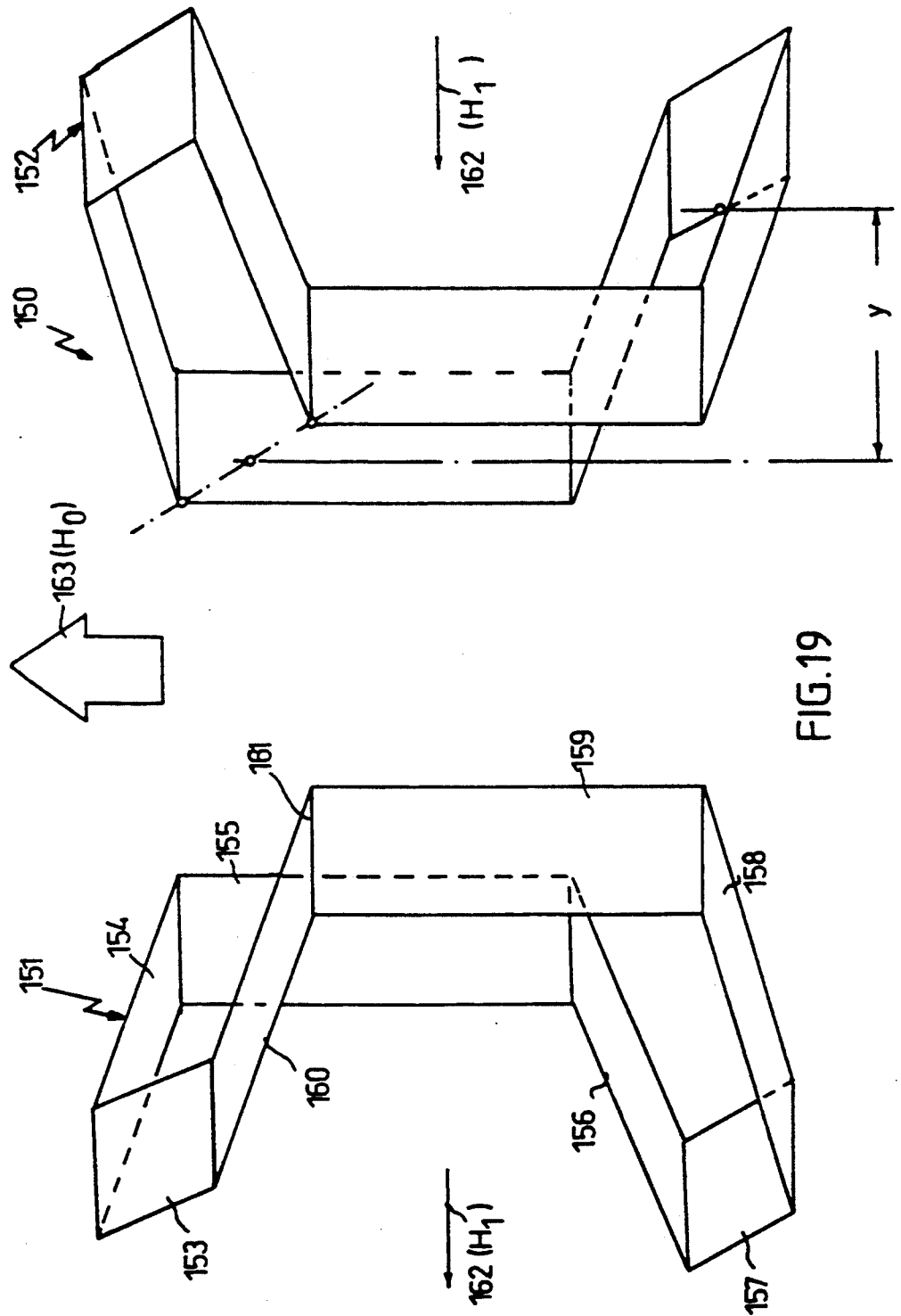
FIG. 19 shows a perspective representation of another embodiment of a sample head where the RF coil is designed in the manner of a polygonal structure, using flat strips.

FIG. 19 shows an eighth embodiment of a sample head 150 according to the invention, using likewise two RF coils 151 and 152 in Helmholtz arrangement.

It is the particularity of the sample head 150 that the RF coils 151, 152 consist of flat strips 153 to 160, the break points between the individual strips, which can be clearly seen in FIG. 19, forming simultaneously the gaps 161 which are, however, not separately shown in the drawing.

If viewed from the side, the arrangement of FIG. 19 would present the shape of a regular octagon. However, the arrangement is such that one obtains again two saddle coils. This is achieved by the fact that the two foremost strips 155 and 159 on each side (viewed toward the measuring space) are set off by an amount y relative to the rearward strips 153 and 157, while the remaining strips 154, 156, 158 and 160 act as connections to the before-mentioned strips.

The field lines of the magnetic RF field $H_1$ are indicated by 162, the field line of the constant magnetic field $H_0$ is indicated by 163 in FIG. 19.

Figure 21:
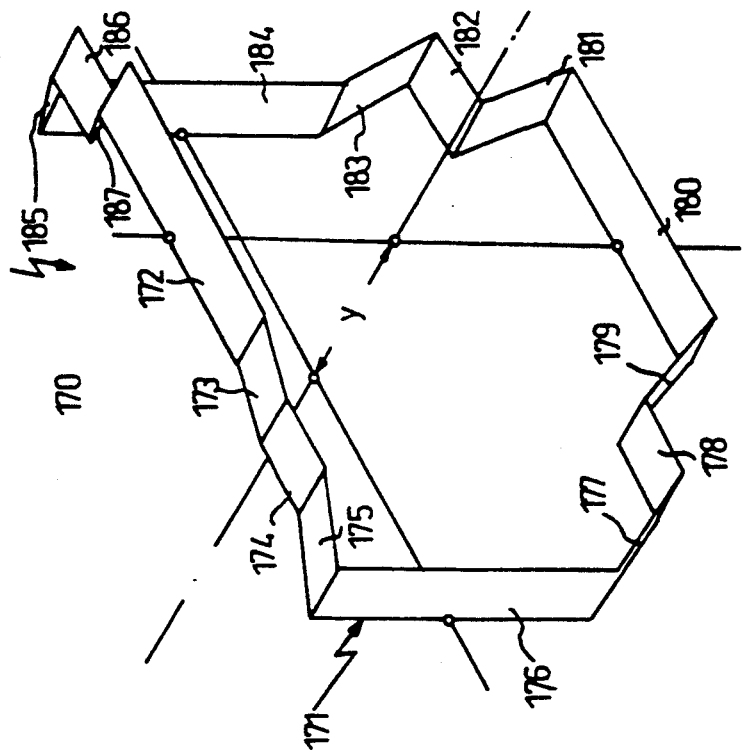
FIG. 21 shows a perspective view of the RF coil illustrated in FIG. 20.
Figure 20:
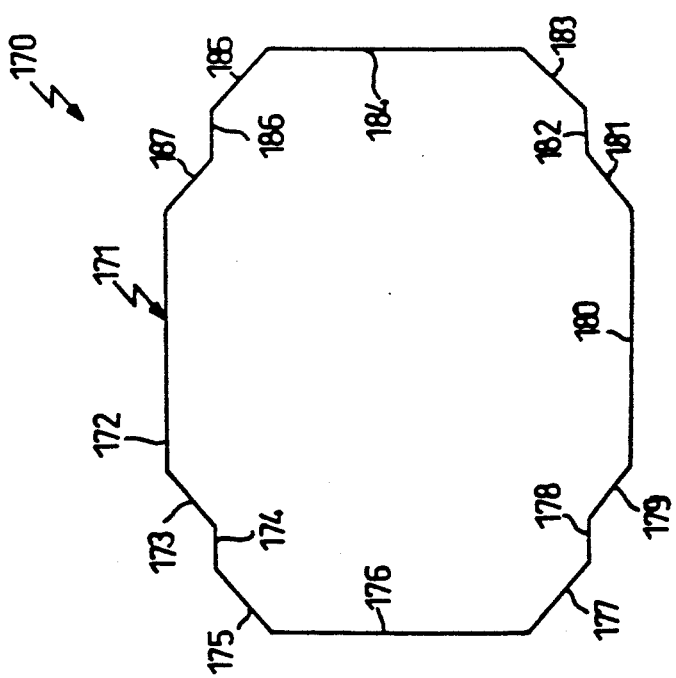
FIG. 20 shows a side view of an RF coil for another sample head designed in the manner of a sixteen-sided structure, using flat strips.

A ninth embodiment 170 of a sample head is illustrated in FIGS. 20 and 21.

In the case of this embodiment, the sample head 170 comprises a RF coil 171 with vertical strips 172 to 187 designed in the manner of a saddle coil similar to the arrangement of FIG. 17, as can be seen best in the perspective representation of FIG. 21. Here again, the saddle shape is the result of the axial offset Y between the two strips 172 and 180 relative to the two strips 176 and 184.

One particularity of the RF coil 171 lies in the fact that four long strips 172, 176, 180 and 184 are used which are interconnected by short strip pieces at their free ends. Among these short strip pieces, the strips 174, 178, 182 and 186 form flat sections provided in symmetrical arrangement relative to each other and relative to the center axis.

Figure 22:
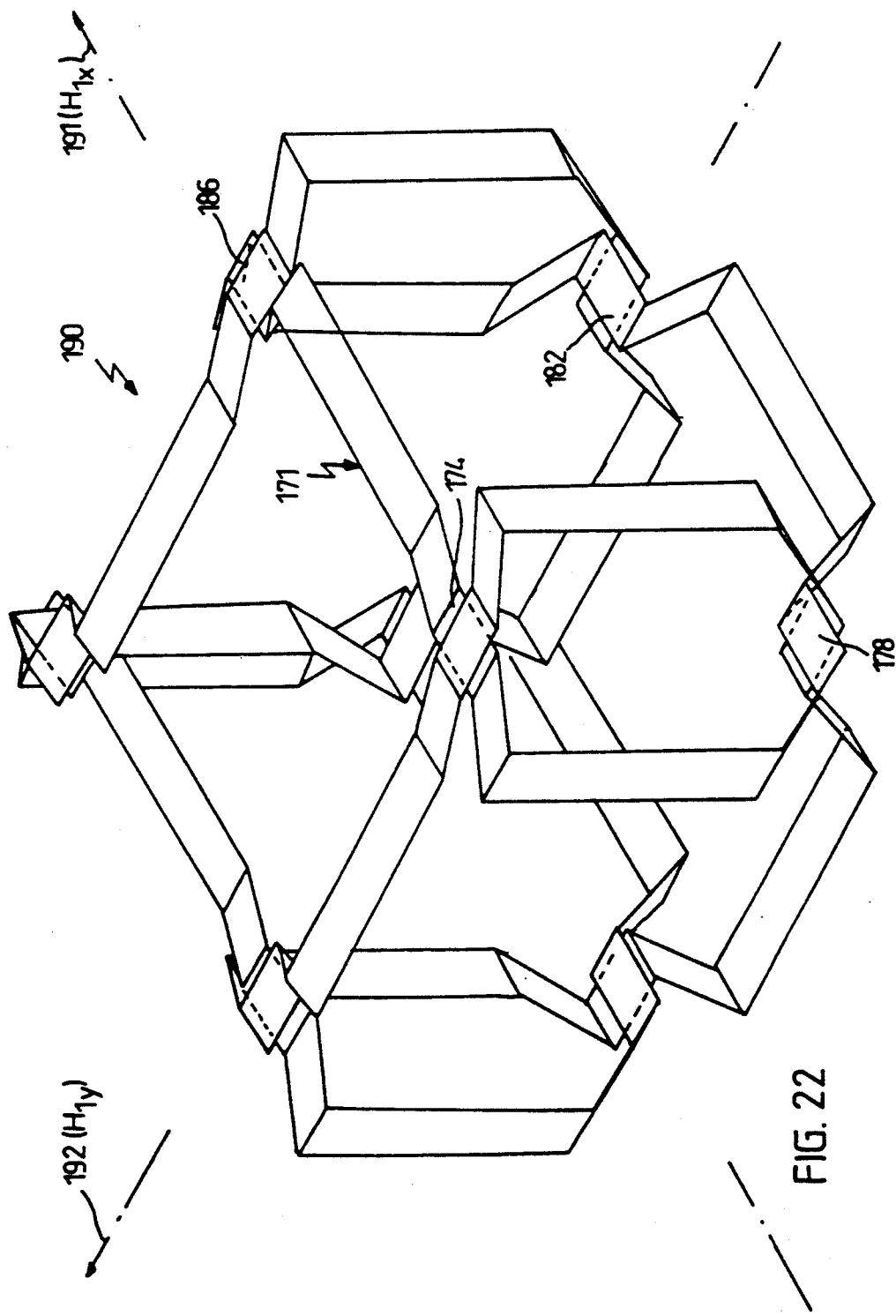
FIG. 22 shows a sample head of a kind similar to that of FIG. 18, but comprising four RF coils according to FIGS. 20 and 21, which are nested in each other and fixed one to the other.

This permits to build up a double Helmholtz arrangement similar to that of FIG. 18, as illustrated in FIG. 22.

The tenth embodiment 190 of a sample head, of which a perspective view is given in FIG. 22, is composed of four RF coils 171 according to FIGS. 20 and 21.

The sections 174, 178, 182 and 186, which are provided in symmetrical arrangement, enable the four coils 171 to be nested one in the other in such a way that the before-mentioned flat sections come to rest one upon the other and can be connected mechanically, but in insulated relationship. It goes without saying that this arrangement is intended only to provide a mechanical connection, no electric interaction, between the respective coils 171.

The resulting structure is again a double Helmholtz arrangement with two axes 191 and 192 for the field lines of the magnetic RF fields $H_{1x}$ and $H_{1y}$.

Figure 23:
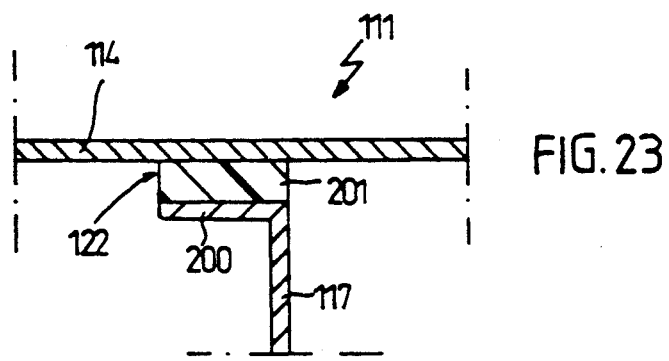
FIG. 23 shows a detail illustrating a first embodiment of an inductive section for an RF coil of a sample head according to the invention.

FIG. 23 is a detail drawing showing the practical design of a gap, illustrated by way of the gap 122 of the RF coil 111 of the sample head 110 according to FIGS. 16 and 17.

It will be readily appreciated from the enlarged detail of FIG. 23 that the upper end of the strip 117 terminates by an angle portion 200 extending in parallel to the strip 114.

The gap 122 formed therebetween is filled with a dielectric 201. The dielectric 201 may be PTFE, in which case it must be considered that the latter's dielectric constant $\epsilon$ is approximately equal to 2.

This not only defines the capacitive section in the area of the gap 122, but permits also a mechanical connection between the angle 200 and the strips 114.

Figure 24:
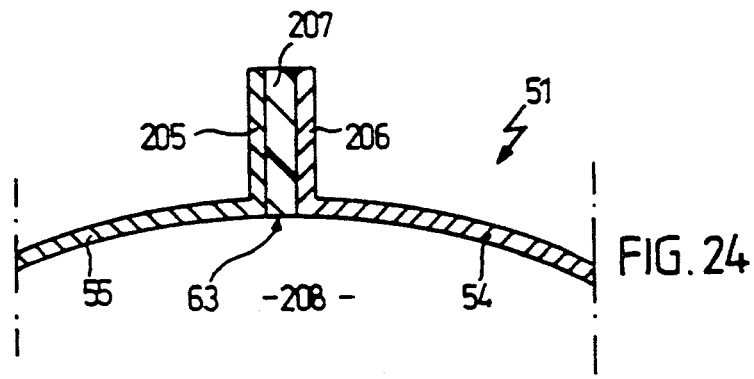
FIG. 24 shows a variant of the detail illustrated in FIG. 23.

The same applies by analogy to the detail illustrated in FIG. 24 where the strips 54 and 55 of the RF coil 51 of the sample head 50 according to FIGS. 5 and 6 are illustrated by way of example.

The strips 54, 55, which enclose between them the gap 53, terminate at their free ends by bent-off portions 205, 206 enclosing between them a dielectric 207 and extending radially outwardly, i.e. away from an inner space 208 of the RF coil 51.

This has the result to displace the electric field lines in outward direction and to reduce their effects on the inner space 208.

Figure 25:
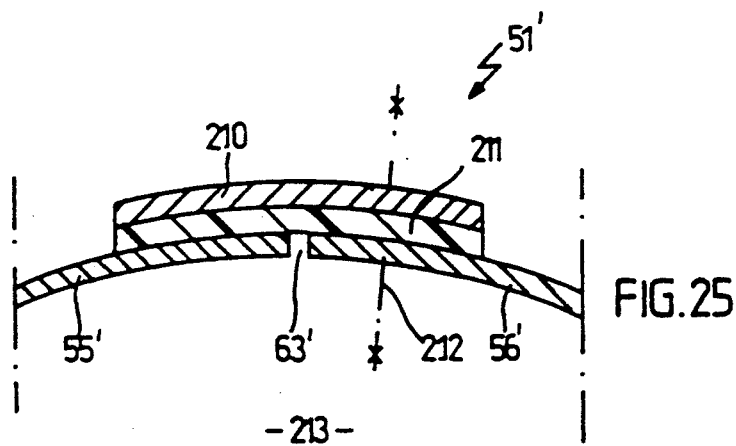
FIG. 25 shows another variant of the detail of FIG. 23.

Finally, FIG. 25 shows a detail illustrating a variant of FIG. 24. The strips 55', 56' are covered in this case by an overlapping metallic strip 210. The gap between the strip 210 and the strips 55', 56' is again filled with a dielectric 211. The gap 63' may remain free, or may also be filled with a dielectric.

The dielectric 211 may consist in this case, just as in the cases illustrated in FIGS. 23 and 24, of an adhesive ensuring at the same time the electric property of the dielectric and the mechanical connection.

Alternatively, or in addition, a screw connection may be provided, as indicated at 212 in FIG. 25. It is understood that in this case an electrically non-conductive screw, for example a PTFE screw, has to be used.

In this case, too, the inner space 213 of the coil 51' is largely freed from electric field lines.

We claim:

1. Sample head for nuclear magnetic resonance whole-body tomography or localized in-vivo nuclear magnetic resonance spectroscopy, comprising an RF coil (11; 31; 51; 81; 101, 102; 111, 112; 141 to 144; 151, 152; 171) having a plurality (n) of inductive sections in the form of metallic strips (13, 14; 33 to 36; 53 to 60; 83 to 88; 114 to 121; 153 to 160; 172 to 187) and capacitive sections arranged alternately one behind the other in the direction of the RF current ($I_1$), so that the field lines (20; 44; 72; 104; 125; 145, 146; 162; 191, 192) of the magnetic RF field ($H_1$) generated by the RF coil (11; 31; 51; 81; 101, 102; 111, 112; 141 to 144; 151, 152; 171) extend in parallel to an axis (21; 45; 74; 126) defined by the RF coil (11; 31; 51; 81; 101, 102; 111, 112; 141 to 144; 151, 152; 171), wherein the said RF coil (31; 51; 81; 101, 102; 111, 112; 141 to 144; 151, 152; 171) forms a single unit with an outer jacket (32; 52; 82; 103; 113) and the number (n) of inductive and capacitive sections is such as to be just below that limit value ($n_k$) above which the distribution (22; 46; 74) of the field lines (19; 43; 71; 97) of the electric RF field ($E_1$) produced by the said RF coil (11; 31; 51; 81; 101, 102; 111, 112; 141 to 144; 151, 152; 171) changes from a first distribution (22; 46; 75), where there is a plane (76) between each inductive section (strip 55) and the said axis (74) in which the strength of the electric RF field ($E_1$) is equal to zero, to a second distribution (98) where the strength of the said electric RF field ($E_1$) rises in a substantially rotationally symmetrical pattern around the said axis (99), and linearly from the said axis (99) toward the said RF coil (81), and this irrespective of the number (n) of inductive sections present.

2. A sample head for performing nuclear magnetic resonance measurements on living objects, in particular for whole-body tomography, or localized in-vivo spectroscopy, comprising:

a high-frequency coil structure defining a longitudinal axis and having a predetermined number (n) of inductive elements shaped as metallic strips extending parallel to said axis, and having an equal number (n) of capacitive elements, said inductive elements and said capacitive elements being arranged alternately one behind the other in a circumferential direction about said axis for surrounding a sample space;

an outer shell of electrically conductive material arranged coaxially to said coil structure and surrounding same at a predetermined radial distance (c), said outer shell and said coil structure forming an integral high-frequency unit; and means for generating a high-frequency electromagnetic field within said coil structure, said field having magnetic field lines ($H_1$) extending essentially parallel to said axis within said sample space, and having electric field lines ($E_1$) and an electric current ($I_1$) flowing through said inductive elements and said capacitive elements along said circumferential direction;

said predetermined number (n) being selected such as to be just below a threshold value ($n_k$) below which said electric field lines ($E_1$) of said electromagnetic field have a first distribution pattern, where there exists within said sample space a plane between each of said inductive elements and said longitudinal axis, in which said electromagnetic field has zero electric field strength, and above which said electric field lines ($E_1$) of said electromagnetic field have a second distribution pattern of rotational symmetry, where said electric field strength within said sample space increases linearly from said longitudinal axis toward said inductive elements and said capacitive elements, respectively, independently from said number (n) above said threshold value ($n_k$).

3. The sample head of claim 2, wherein said capacitive elements are designed as gaps extending in parallel to said magnetic field lines ($H_1$).

4. The sample head of claim 3, wherein said gaps are repleted with a dielectric material.

5. The sample head of claim 3, wherein edges of said metallic strips adjoining said gaps are bent off in a radial direction away from said longitudinal axis for making said capacitive elements to lie radially outside said sample space.

6. The sample head of claim 2, wherein said strips are flat.

7. The sample head of claim 2, wherein said metallic strips are curved, preferably bent cylindrically about said longitudinal axis.

8. The sample head of claim 2, wherein said metallic strips are rigidly interconnected at said capacitive elements.

9. The sample head of claim 8, wherein said metallic strips are bonded together by means of an adhesive.

10. The sample head of claim 9, wherein said adhesive forms a dielectric.

11. The sample of claim 8, wherein said metallic strips are bolted together in insulated relationship.

12. The sample head of claim 3, wherein said gaps have a width (d) in said circumferential direction of said electric current ($I_1$) being between 0.1% and 2%, preferably in the range of 0.5% of a circumference of said coil structure.

13. The sample head of claim 2, wherein a first dimension (1) of said metallic strips, in said circumferential direction of said electric current ($I_1$) is not greater than four times a second dimension (a) perpendicular thereto.

14. The sample head of claim 13, wherein said second dimension (a) of said metallic strips is equal to between 10% and 50%, preferably 20%, of a diameter (D) of said coil structure.

15. The sample head of claim 14, wherein said outer shell has a substantially circular-cylindrical shape and surrounds said coil structure at said radial distance (c) being equal to between 5% and 20%, preferably 10%, of said diameter (D) of said coil structure.

16. The sample head of claim 2, wherein said coil structure comprises two coil sub-structures in Helmholtz arrangement.

17. The sample head of claim 16, wherein said coil sub-structures are designed as saddle coils.

18. The sample head of claim 17, wherein said saddle coils comprise two annular segment strips, as well as two elongated strips being preferably curved in their longitudinal and/or transverse direction, said elongate strips extending essentially parallel to said axis and having free ends extending at an angle of 90° relative to said annular segment strips.

19. The sample head of claim 2, wherein said coil structure comprises two pairs of coil sub-structures, each of which forming a pair in Helmholtz arrangement with axes of said pairs extending perpendicularly one to the other.

20. The sample head of claim 19, wherein said coil sub-structures are designed as saddle coils.

21. The sample head of claim 20, wherein said saddle coils comprise two annular segment strips, as sell as two elongated strips being preferably curved in their longitudinal and/or transverse direction, said elongate strips extending essentially parallel to said axis and having free ends extending at an angle of 90° relative to said annular segment strips.

22. The sample head of claim 20, wherein said saddle coils are designed and arranged such that each saddle coil of one of said coil sub-structures is in contact with, and fixed to, the two other saddle coils of the other one of said coil sub-structures by at least one point.

23. The sample head of claim 2, wherein at least one electric grounding line for said electric current ($I_1$) is designed for supporting said coil structure on said outer shell.

24. The sample head of claim 2, wherein said head is designed as a surface coil to be applied to a surface of said living object.

* * * * *